United States Patent [19]

Phillips

[11] Patent Number: 4,573,791
[45] Date of Patent: Mar. 4, 1986

[54] STEP-AND-REPEAT PROJECTION ALIGNMENT AND EXPOSURE SYSTEM
[75] Inventor: Edward H. Phillips, Middletown, Calif.
[73] Assignee: Optimetrix Corporation, Mountain View, Calif.
[21] Appl. No.: 649,767
[22] Filed: Sep. 12, 1984

Related U.S. Application Data

[60] Division of Ser. No. 396,099, Jul. 7, 1982, Pat. No. 4,473,293, which is a continuation of Ser. No. 26,722, Apr. 3, 1979, abandoned.
[51] Int. Cl.⁴ .................... G03B 27/32; G03B 27/42
[52] U.S. Cl. ........................ 355/77; 355/43; 355/45; 355/53; 356/401
[58] Field of Search ................ 356/399, 401; 355/77, 355/43, 53, 45, 46, 67, 18, 32, 132; 354/4; 33/180 R

[56] References Cited

U.S. PATENT DOCUMENTS

| | | | |
|---|---|---|---|
| 3,192,844 | 7/1965 | Szasz et al. | 355/78 |
| 3,461,566 | 8/1969 | Gerstner | 33/180 |
| 3,476,476 | 11/1969 | Chitayat | 355/1 |
| 3,563,648 | 2/1971 | Baggaley et al. | 355/46 |
| 3,610,750 | 10/1971 | Lewis et al. | 355/43 |
| 3,685,117 | 8/1972 | Wing et al. | 29/760 |
| 3,704,946 | 12/1972 | Brault et al. | 355/46 |
| 3,716,296 | 2/1973 | Springer et al. | 355/53 |
| 3,853,398 | 12/1974 | Kano | 355/43 |
| 3,876,301 | 4/1975 | Kosugi | 355/53 |
| 3,917,399 | 11/1975 | Buzawa et al. | 355/43 |
| 3,937,579 | 2/1976 | Schmidt | 355/132 X |
| 3,940,211 | 2/1976 | Johannsmeier | 355/53 |
| 3,984,186 | 10/1976 | Momose et al. | 355/45 |
| 4,011,011 | 3/1977 | Hemstreet et al. | 355/18 |
| 4,040,736 | 8/1977 | Johannsmeier | 355/45 |
| 4,057,347 | 11/1977 | Moriyama et al. | 355/67 |
| 4,110,762 | 8/1978 | Tigreat | 354/4 |
| 4,128,331 | 12/1978 | Nakamura | 355/32 |
| 4,311,390 | 1/1982 | Phillips | 356/363 X |
| 4,362,389 | 12/1982 | Koizumi et al. | 356/401 |
| 4,367,046 | 1/1983 | Lacombat | 355/53 |
| 4,473,293 | 9/1984 | Phillips | 355/53 |

FOREIGN PATENT DOCUMENTS

| | | |
|---|---|---|
| 17044 | 10/1980 | European Pat. Off. . |
| 17759 | 10/1980 | European Pat. Off. . |
| 2009284 | 9/1970 | Fed. Rep. of Germany . |
| 2817364 | 10/1978 | Fed. Rep. of Germany ........ 355/53 |
| 1508408 | 11/1967 | France . |
| 2082213 | 10/1971 | France . |
| 2247050 | 5/1975 | France . |
| 2375631 | 7/1978 | France . |
| 2388371 | 11/1978 | France . |

OTHER PUBLICATIONS

Patent Abstracts of Japan, vol. 2, No. 92, 7/28/78, p. 4306, E 78, JP-A-53-56975.
Solid State Technology, vol. 23, No. 8, Aug. 1980, "The Unique Fully Automatic Direct Wafer Steppers from Optimetrix Are Now in Production", circle 93.

Primary Examiner—Richard A. Wintercorn
Attorney, Agent, or Firm—Roland I. Griffin

[57] ABSTRACT

An alignment and exposure system is provided with a main stage movable along orthogonal axes to position either a reference mark, aligned with one of those axes, or a semiconductive wafer directly beneath a projection lens. Another stage is disposed above the projection lens to position a reticle, selectively illuminated by a light source unit, with respect to the reference mark. The light source unit includes a lamp for directing illumination and exposure light along an optical path extending through the reticle and projection lens, a pair of filters for selectively controlling whether illumination or exposure light passes along that optical path to the reticle, a pair of shutters for selectively controlling passage of the selected light along that optical path to the reticle, and a plurality of different mask plates for selectively controlling the portions of the reticle illuminated by the selected light when one of the shutters is opened. Images of the illuminated portions of the reticle are projected onto the reference mark or semiconductive wafer by the projection lens. A beam splitter is disposed between the projection lens and reticle to provide a port for viewing aerial images of the portions of the reference mark or semiconductive wafer illuminated by the projected images of the illuminated portions of the reticle. While employing a microscope to view those aerial images, either stage may be controlled to directly align either the semiconductive wafer with respect to the reticle or the reticle with respect to the reference mark.

8 Claims, 20 Drawing Figures

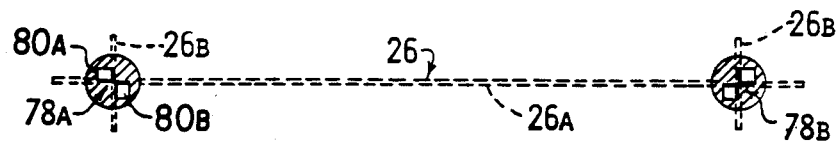
FIGURE 7
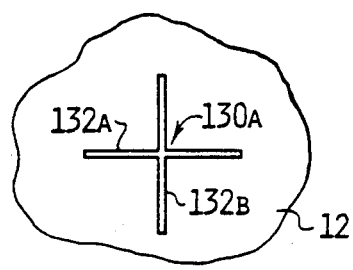
FIGURE 8
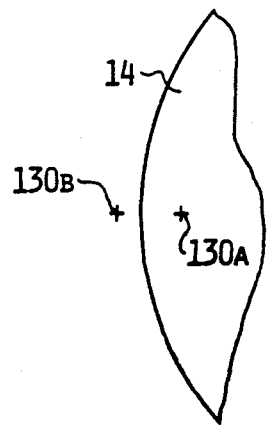 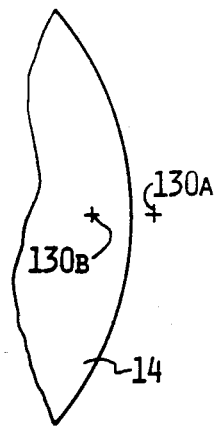
FIGURE 9A          FIGURE 9B

STEP-AND-REPEAT PROJECTION ALIGNMENT AND EXPOSURE SYSTEM

CROSS REFERENCE TO RELATED APPLICATIONS

This is a divisional of U.S. patent application Ser. No. 396,099 entitled IMPROVED STEP-AND-REPEAT PROJECTION ALIGNMENT AND EXPOSURE SYSTEM, filed July 7, 1982, and issued Sept. 25, 1984, as U.S. Pat. No. 4,473,293, which is a continuation of U.S. patent application Ser. No. 026,722 filed Apr. 3, 1979, and now abandoned.

BACKGROUND AND SUMMARY OF THE INVENTION

This invention relates generally to step-and-repeat alignment and exposure systems utilizing a projection lens of the reduction type for the photometric printing of an image of a first object, such as a reticle, upon a second object, such as photomask or a semiconductive wafer, and, more specifically, to apparatus for use in such systems to achieve precise relative alignments of a reticle and a semiconductive wafer with respect to coordinate axes of motion of a movable stage for holding the semiconductive wafer.

In the semiconductor industry projection lenses of the reduction type are employed both in the fabrication of photomasks and in the processing of semiconductive wafers to form integrated circuits and the like. A high (submicron) resolution photomask is typically fabricated by utilizing a precisely controlled stage to successively position adjacent regions of the photomask with respect to an image (formed by such a projection lens) of a reticle containing a level of microcircuitry that is printed on the photomask at each of those regions. This step-and-repeat printing operation forms an array of adjacent regions of microcircuitry of one level on the photomask in rows and columns parallel to the coordinate axes of motion of the stage. A set of such photomasks, each bearing an array of microcircuitry of a different level, is typically employed in the fabrication of integrated circuits or the like from a semiconductive wafer. In the course of this fabrication, the semiconductive wafer is sequentially aligned with each photomask of the set and the level of microcircuitry printed on the photomask is in turn printed on the semiconductive wafer. However, it is also possible to eliminate the operation of fabricating a set of such photomasks by employing a precisely controlled stage to successively position adjacent regions of the semiconductive wafer with respect to each of the reticles employed in fabricating the set of photomasks so that the level of microcircuitry contained on each of those reticles may be printed directly on the semiconductive wafer at each of those regions during separate step-and-repeat printing operations.

In order to facilitate the precise positioning or alignment of one level of microcircuitry being printed on a semiconductive wafer at each of an array of adjacent regions thereof relative to another level of microcircuitry previously printed or yet to be printed on the semiconductive wafer at each of those same regions, it would be highly desirable to employ a step-and-repeat alignment and exposure system utilizing a projection lens of the reduction type in the optical portion thereof while allowing direct viewing and alignment of a reticle, or an image of the reticle, with respect to the coordinate axes of motion of the stage, and further allowing direct viewing and alignment of microcircuitry previously printed on the semiconductive wafer at each of those regions with respect to the reticle, or image of the reticle. Unfortunately, however, conventional step-and-repeat alignment and exposure systems utilizing projection lenses of the reduction type do not allow such direct viewing and alignment of either the reticle, or an image of the reticle, or the semiconductive wafer.

Accordingly, it is the principal object of this invention to provide an improved step-and-repeat alignment and exposure system incorporating a projection lens of the reduction type in the optical portion thereof while allowing direct viewing and alignment of an image of a first object, such as a reticle, and of a second object, such as a semiconductive wafer.

Another object of this invention is to provide the optical portion of the step-and-repeat alignment and exposure system with a viewing port for observing the image plane of the projection lens.

Another object of this invention is to provide the optical portion of the step-and-repeat alignment and exposure system with masking apparatus for selectively illuminating different portions of the reticle.

Another object of this invention is to provide the step-and-repeat alignment and exposure system with a controlled movable stage having a visible reference mark that is indicative of at least one of coordinate axes of motion of the stage.

Another object of this invention is to provide the step-and-repeat alignment and exposure system with a reticle alignment subsystem for precisely and repeatably aligning an image of each reticle of a set of different reticles with respect to the axes of motion of the controlled movable stage.

Another object of this invention is to provide the step-and-repeat alignment and exposure system with a wafer alignment subsystem for precisely aligning a previously-printed array of adjacent regions of microcircuitry on the semiconductive wafer with respect to the axes of motion of the controlled movable stage.

Still another object of this invention is to provide the step-and-repeat alignment and exposure system with a wafer alignment subsystem for directly aligning the previously-printed regions of microcircuitry on the semiconductive wafer with respect to an image of each reticle of a set of different reticles.

These and other objects, which will become apparant from an inspection of the accompanying drawings and a reading of the associated description, are accomplished according to the illustrated preferred embodiment of this invention by providing a step-and-repeat alignment and exposure system including a main stage controlled for movement to different positions along orthogonal X and Y axes; a chuck mounted on the main stage for supporting a semiconductive wafer thereon; a substage mounted on the main stage for aligning a reference mark on the substage with one of the X and Y axes of motion of the main stage; another stage controlled for aligning an image of a reticle supported thereon with the reference mark; a projection lens of the reduction type mounted between the main stage and the other stage for imaging illuminated portions of the reticle onto portions of the reference mark or the semiconductive wafer, depending on the position to which the main stage is moved; a light source for directing illumination and exposure light along an optical path extending through the reticle; a pair of filters and a compensating lens mounted for selectively controlling the type of light (i.e., whether illumination light or exposure light passing along that optical path to the reticle and for accommodating the projection lens for the type of light selected; a pair of shutters mounted for selectively controlling the passage of light along that optical path to the reticle; a plurality of different mask plates mounted for selectively controlling the portions of the reticle illuminated by the light passing along that optical path when one of the shutters is opened; and a beam splitter mounted between the projection lens and the reticle for providing a viewing port at which an aerial image of the portions of the reference mark or semiconductive wafer illuminated by the projected image of the illuminated portions of the reticle may be viewed.

The step-and-repeat alignment and exposure system also includes a first objective lens unit that may be moved into an operative position for use with an ocular lens unit to permit viewing of the aerial image provided at the viewing port while controlling the main stage is controlled to directly align either the reticle with the reference mark or the semiconductive wafer with the reticle; a pair of prealignment reticles mounted above the main stage and aligned with respect to the reference mark to permit prealignment of the semiconductive wafer with respect to the reference mark (and, hence, the reticle); and a second objective lens unit for imaging this pair of prealignment reticles onto a corresponding pair of alignment marks on the semiconductive wafer when the main stage is moved to position the semiconductive wafer directly beneath the second objective lens unit and for providing aerial images of the pair of alignment marks on the semiconductive wafer illuminated by the projected images of the pair of prealignment reticles. This second objective lens unit may be moved into the operative position (in lieu of the first objective lens unit) for use with the ocular lens unit to permit viewing of these aerial images while the main stage is controlled to align the pair of alignment marks on the semiconductive wafer with the corresponding pair of prealignment reticles. Once the semiconductive wafer has been so aligned, the main stage may be controlled to step an array of adjacent regions of the semiconductive wafer directly beneath the projection lens to permit direct alignment of selected ones of those regions with the reticle while employing the first objective lens unit with the ocular lens unit for viewing an aerial image of an auxiliary alignment mark previously printed alongside each selected region and illuminated by a corresponding alignment mark on the reticle and to further permit printing of a level of microcircuitry contained on the reticle at each of the array of adjacent regions.

DESCRIPTION OF THE DRAWINGS

FIG. 7 is a plan view of the end portions of the reference mark formed on the reference mark plate of FIG. 3 as illuminated by projected images of a pair of reticle alignment marks.

FIG. 8 is a plan view of one of a pair of wafer alignment marks contained on a first reticle of a set of reticles employed with the step-and-repeat alignment and exposure system of FIGS. 1A–C.

FIG. 9A–B are plan views illustrating how a pair of wafer alignment marks is printed on a semiconductive wafer by the step-and-repeat alignment and exposure system of FIGS. 1A–C.

DESCRIPTION OF THE PREFERRED EMBODIMENT

Figure 1A:
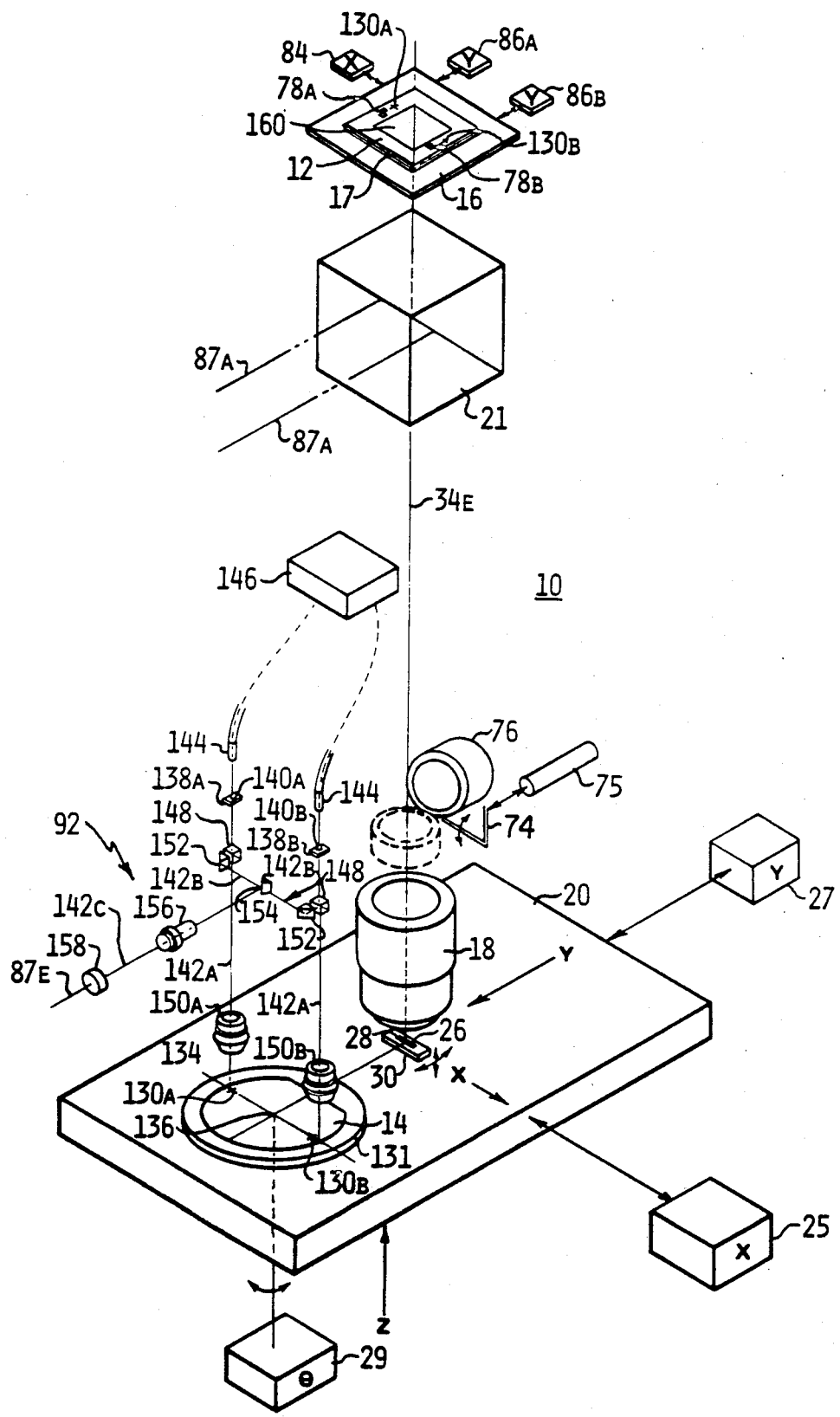
FIGS. 1A–C are perspective views of different portions of a step-and-repeat alignment and exposure system in accordance with the preferred embodiment of the present invention.

Referring now to FIGS. 1A-C and 2, there is shown a precision step-and-repeat alignment and exposure system 10 for repeatedly printing one level of microcircuitry, contained on a first object, such as a reticle 12, at an array of adjacent regions of a second object, such as a semiconductive wafer 14, in alignment with other levels of microcircuitry previously printed or yet to be printed at those same regions. Alignment and exposure system 10 includes a stage 16 for holding the reticle 12, a 10:1 projection lens 18 for projecting an image of illuminated portions of the reticle onto a reference mark 26 or the semiconductive wafer 14, a main stage 20 for positioning the reference mark or the semiconductive wafer with respect to the projected image of the illuminated portions of the reticle, a beam splitter 21 and a compound microscope 22 for viewing aerial images of portions of the reference mark or semiconductive wafer illuminated by the projected image of the reticle, and a light source unit 24 for selectively illuminating different portions of the reticle (with either illumination or exposure light) for viewing those aerial images during alignment operations and for selectively exposing a photosensitive film on the semiconductive wafer during step-and-repeat printing operations.

With reference now particularly to FIG. 1A, main stage 20 may comprise an interferometrically-controlled stage of the type shown and described in detail in copending U.S. patent application Ser. No. 015,713 entitled INTERFEROMETRICALLY CONTROLLED STAGE WITH PRECISELY ORTHOGONAL AXES OF MOTION, filed on Feb. 27, 1979, by Edward H. Phillips, issued as U.S. Pat. No. 4,311,390 on Jan. 19, 1982. and incorporated by reference herein. As fully described in that application, main stage 20 may be moved along orthogonal X and Y axes to any position in a horizontal plane by X and Y axes servo drive units 25 and 27. Either axis of motion of main stage 20 may therefore be employed as an absolute frame of reference, and the X axis is so employed, for alignment and exposure system 10, as hereinafter explained.

Figure 3:
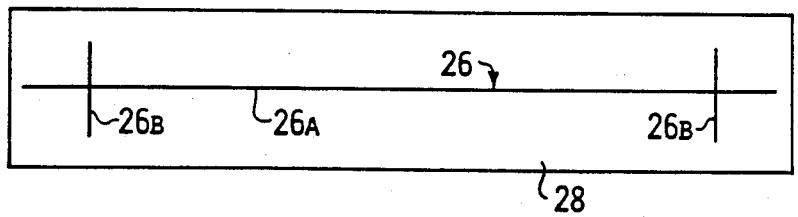
FIG. 3 is a plan view of a reference mark plate employed in the step-and-repeat alignment and exposure system of FIGS. 1A–C.

Reference mark 26 may be formed of bright chrome on a reference mark plate 28 fixedly mounted on a substage 30, which is in turn adjustably mounted on main stage 20. As best shown in FIG. 3, reference mark 26 may comprise a straight line 26a of about 12.7 millimeters in length and about 4 microns in width, and a pair of identical tic marks 26b of about 0.4 millimeters in length and about 4 microns in width. These tic marks 26b symmetrically and orthogonally intersect line 26a near the opposite ends thereof and are spaced 10.3 millimeters apart center-to-center).

Substage 30 in mounted for universal pivotal movement with respect to the plane of main stage 20 to permit positioning of reference mark plate 28 in a plane parallel to a first image plane 77 (see FIG. 2) of projection lens 18 as desired for proper focusing of reference mark 26. Substage 30 is also mounted for angular movement in the plane of main stage 20 to permit precise alignment of line 26a of reference mark 26 with the X axis of motion of the main stage as desired to provide a visual indication of the X axis of motion and thereby facilitate use of the X axis of motion as an absolute frame of reference for alignment and exposure system 10. In initially setting up alignment and exposure system 10, substage 30 is manually adjusted (by adjustment screws not shown) to achieve the desired parallel-plane positioning of reference mark plate 28 and the desired alignment of line 26a of reference mark 26. Although this substage adjustment operation should only have to be performed once during the life of alignment and exposure system 10, it may be advisable to check the parallel-plane positioning of reference mark plate 28 and the alignment of line 26a of reference mark 26 from time to time. The manner in which the substage adjustment operation is performed will now be described with reference to the parts of alignment and exposure system 10 employed in that operation.

Figure 1B:
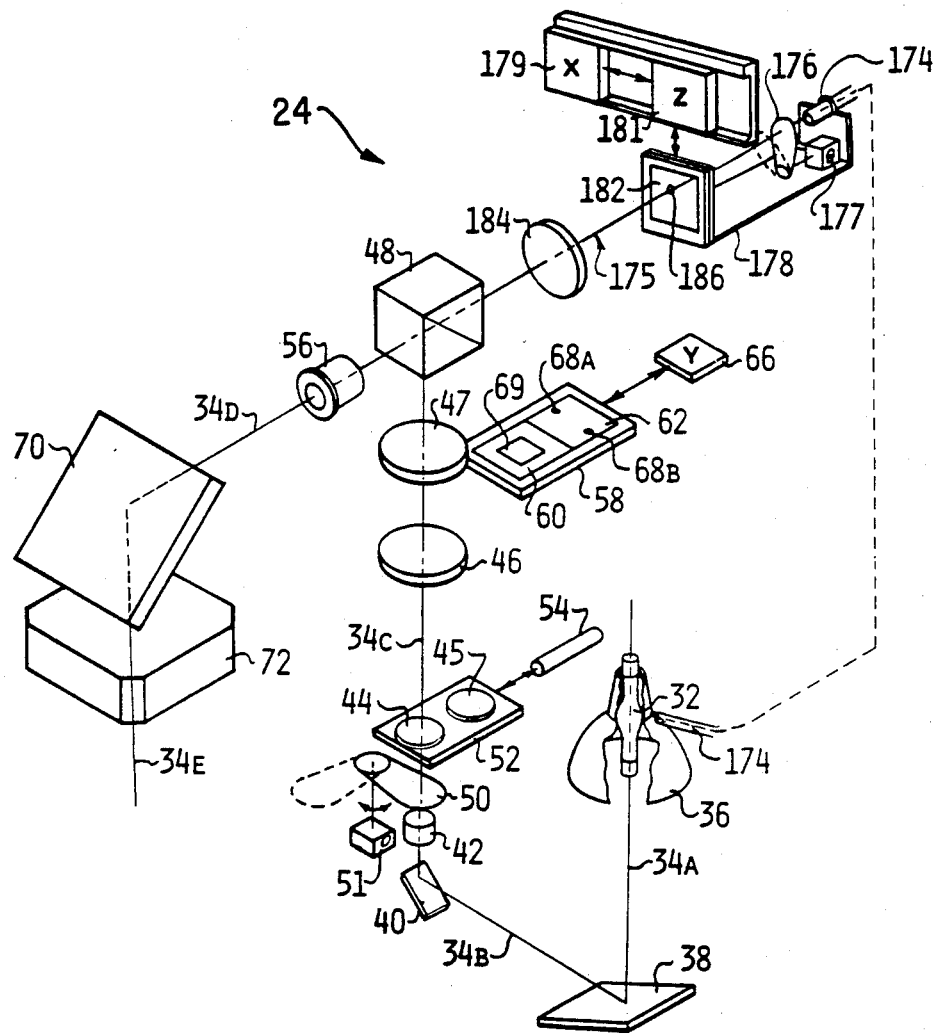

With reference now particularly to FIG. 1B, light source unit 24 includes a mercury arc lamp 32 for emitting a spectrum of light energy including both green illuminating light having a wavelength of about 547 nanometers for illuminating but not exposing the photosensitive film on semiconductive wafer 12, and blue illuminating and exposure light having a wavelength of about 436 nanometers for both illuminating and exposing the photosensitive film on the semiconductive wafer (herein simply referred to as exposure light). Mercury arc lamp 32 is fixedly mounted along a vertically extending portion 34a of an optical path 34a-e of alignment and exposure system 10. An elliptical reflector 36 surrounds mercury arc lamp 32 and is fixedly coaxially mounted therewith for projecting a beam of light emitted by the mercury arc lamp downward to a band reflecting plane mirror 38. This band reflecting plane mirror 38 has a multilayer dielectric coating for reflecting blue and green light, but transmitting all other light, in the beam of light to prevent unnecessary energy from being transmitted along the remaining portions of optical path 34a-e. Band reflecting plane mirror 38 is fixedly mounted in optical path 34a-e at an angle of forty-five degrees with respect to the vertically extending portion 34a thereof so as to deflect the blue and green light in the beam of light along a horizontally extending portion 34b of that optical path to a plane mirror 40.

Plane mirror 40 is fixedly mounted in optical path 34a-e at an angle of forty-five degrees with respect to the horizontally extending portion 34b thereof so as to deflect the beam of blue and green light incident thereon upward along another vertically extending portion 34c of that optical path. The beam of light so deflected thereupon passes through a light integrator 42 and, when a normally closed shutter 50 is opened as during the substage adjustment operation, also through a blue or a green filter 44 or 45 and a pair of positive lenses 46 and 47 to a beam splitter 48. Light integrator 42 is fixedly mounted in the vertically extending portion 34c of optical path 34a-e and is employed for providing the beam of light passing therethrough with a cross section corresponding to the entrance pupil of projection lens 18 and with a uniform intensity distribution in the plane of reticle 12.

Shutter 50 is pivotally mounted adjacent to the vertically extending portion 34c of optical path 34a-e and is controlled by a $\theta$ servo drive unit 51 for pivotal movement into that optical path (as shown in solid lines) when closed so as to block passage of the beam of light therealong and for pivotal movement out of that optical path (as shown in dashed lines) when opened so as to permit passage of the beam of light therealong. Blue filter 44 and green filter 45 are fixedly mounted in horizontally spaced relationship on a slide 52 which is in turn reciprocally mounted in a horizontal plane orthogonally intersecting the vertically extending portion 34c of optical path 34a-e. Slide 52 is moved along the Y axis under control of an air cylinder 54 to position either the blue filter 44 or the green filter 45 in the path of the beam of blue and green light passing upward along the vertically extending portion 34c of optical path 34a-e when shutter 50 is opened. Blue filter 44 is normally so positioned and therefore passes the blue light in the beam of light to the pair of positive lenses 46 and 47 while filtering out the green light and any other non-blue light that may still be present in the beam of light.

Figure 4:
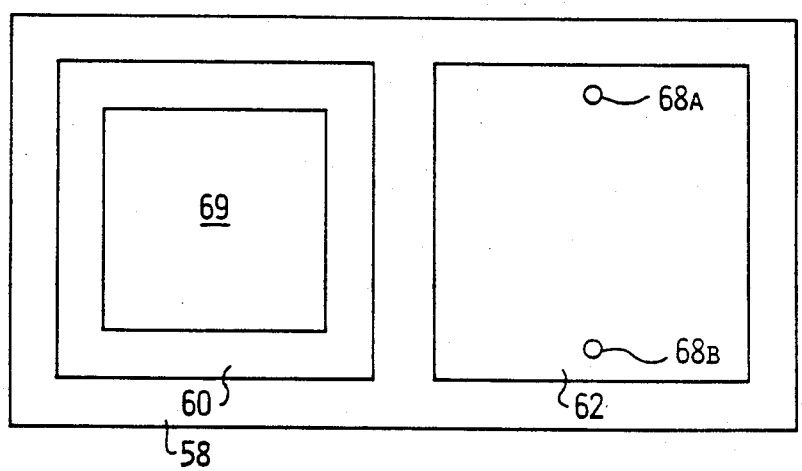
FIG. 4 is a plan view of a slide holding two different masks employed in the step-and-repeat alignment and exposure system of FIGS. 1A–C.

Positive lenses 46 and 47 are fixedly mounted in the vertically extending portion 34c of optical paths 34a-e to image the output of light integrator 42 at the entrance pupil of an imaging lens 56. A slide 58 is mounted for movement along the Y axis under control of a Y axis servo drive unit 66 to selectively position either of two separate mask plates 60 and 62 at an operative position directly between positive lenses 46 and 47 in a horizontal plane orthogonally intersecting the vertically extending portion 34c of optical path 34a-e at a point midway between those positive lenses. Light appearing in this plane between positive lenses 46 and 47 is imaged onto reticle 12. During the substage adjustment operation, slide 58 is moved by Y axis servo drive unit 66 to locate mask plate 62 in an operative position between positive lenses 46 and 47 so that a pair of small circular openings 68a and 68b of mask plate 62 (best shown in FIG. 4), permit the blue light passed by blue filter 44 to illuminate a corresponding pair of circular areas about 2 millimeters in diameter disposed on the surface of reticle 12 and containing a pair of reticle alignment marks 78a and 78b, respectively.

Beam splitter 48 is fixedly mounted in the vertically extending portion 34c of optical path 34a-e so as to reflect eighty percent of the incident light along a horizontally extending portion 34d of that optical path through imaging lens 56 to a plane mirror 70. Imaging lens 56 is fixedly mounted along the horizontally extending portion 34d of optical path 34a-e and is employed to image the light passing through mask plate 62 at the surface of reticle 12. Plane mirror 70 is fixedly mounted in optical path 34a-e at an angle of forty-five degrees with respect to the horizontally extending portion 34d thereof so as to deflect the light incident thereon downward along a vertically extending portion 34e of that optical path. This downwardly deflected light passes through a positive lens 72, reticle 12, and beam splitter 21 to projection lens 18. Positive lens 72 is fixedly mounted along the vertically extending portion 34e of optical path 34a-e so as to image light appearing at the output pupil of imaging lens 56 at the input pupil of projection lens 18.

Figure 2:
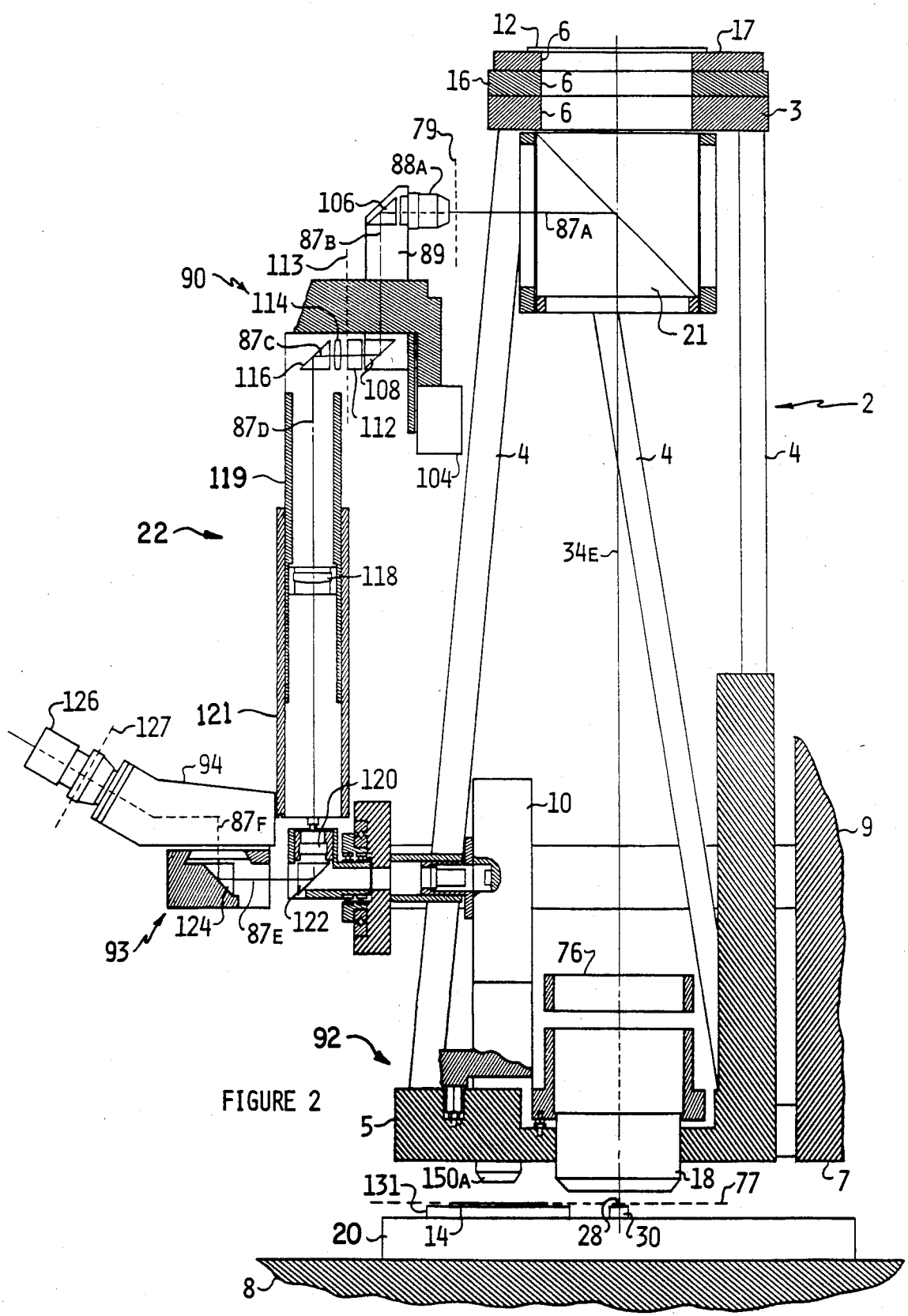
FIG. 2 is a half-sectional, partially out-away elevational view of a portion of the step-and-repeat alignment and exposure system of FIGS. 1A–C.
Figure 5:
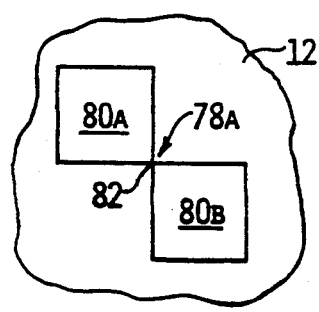
FIG. 5 is a plan view of one of a pair of reticle alignment marks contained on each reticle employed with the step-and-repeat alignment and exposure system of FIGS. 1A–C.

With reference now particularly to FIGS. 1A and 2, each reticle 12 to be employed with alignment and exposure system 10 has a pair of oppositely-facing reticle alignment marks 78a and 78b spaced 103 millimeters apart (center-to-center) along the X axis when the reticle is properly aligned on stage 16. As best shown in FIG. 5, each reticle alignment mark 78a or 78b may comprise a pair of light or transparent windows 80a and 80b (each about 0.75 millimeters square) on a dark or opaque field. These windows 80a and 80b are symmetrically disposed about the center 82 of the alignment mark on opposite sides of a pair of orthogonal centerlines of the alignment mark (one of those centerlines being coincident with a common centerline of both alignment marks). Stage 16 is provided with a vacuum holder 17, as shown in FIG. 2, for releasably holding reticle 12 in place, and is moved by X and differentially-controlled Y axes servo drive units 84, 86a, and 86b to adjust the X, Y, and $\theta$ orientation of the reticle as required to precisely align the reticle alignment marks 78a and 78b of the reticle with reference mark 26 as hereinafter explained.

Beam splitter 21 is mounted in the vertically extending portion 34e of optical path 34a-e so as to pass eighty percent of the light passing through reticle 12 to projection lens 18, which is also mounted in that portion of optical path 34a-e. A compensating lens 76 is pivotally mounted adjacent to projection lens 18 and controlled by a crank 74 and an air cylinder 75 for movement out of the vertically extending portion 34e of optical path 34a-e (as shown in solid lines) when blue light is passing therealong to the projection lens, as is normally the case, and for movement into the vertically extending portion 34e of that optical path (as shown in dashed lines) when green light is passing therealong to the projection lens. The compensating lens 76 is employed to compensate for the difference in wavelength of the green light and the blue light since projection lens 18 is corrected for the blue light only.

Projection lens 18 focuses the light passing through reticle 12 at the first image plane 77 adjacent to main stage 20 and directly beneath the projection lens, thereby projecting images of illuminated portions of reticle 12 (and, hence, of the reticle alignment marks 78a and 78b contained on the reticle and illuminated by mask plate 62 when shutter 50 is opened) onto whatever object is positioned in that image plane directly beneath the projection lens. The portions of that object onto which those images are projected are therefore illuminated by the blue light passing through the transparent reticle alignment marks 78a and 78b on reticle 12. Twenty percent of the light reflected vertically upward from those portions of that object through projection lens 18 is reflected by beam splitter 21 along horizontally extending portions 87a of a dual optical path 87a-f to a second image plane 79 positioned the same optical distance from the beam splitter as is the reticle 12 and positioned between the beam splitter and objective lenses 88a and 88b of compound microscope 22. Projection lens 18 focuses this reflected light at the second image plane 79 thereby projecting an aerial image of those portions of the object positioned in the first image plane 77 directly beneath the projection lens (i.e., those portions illuminated by the projected images of the reticle alignment marks 78a and 78b contained on the reticle 12) to the second image plane.

Figure 1C:
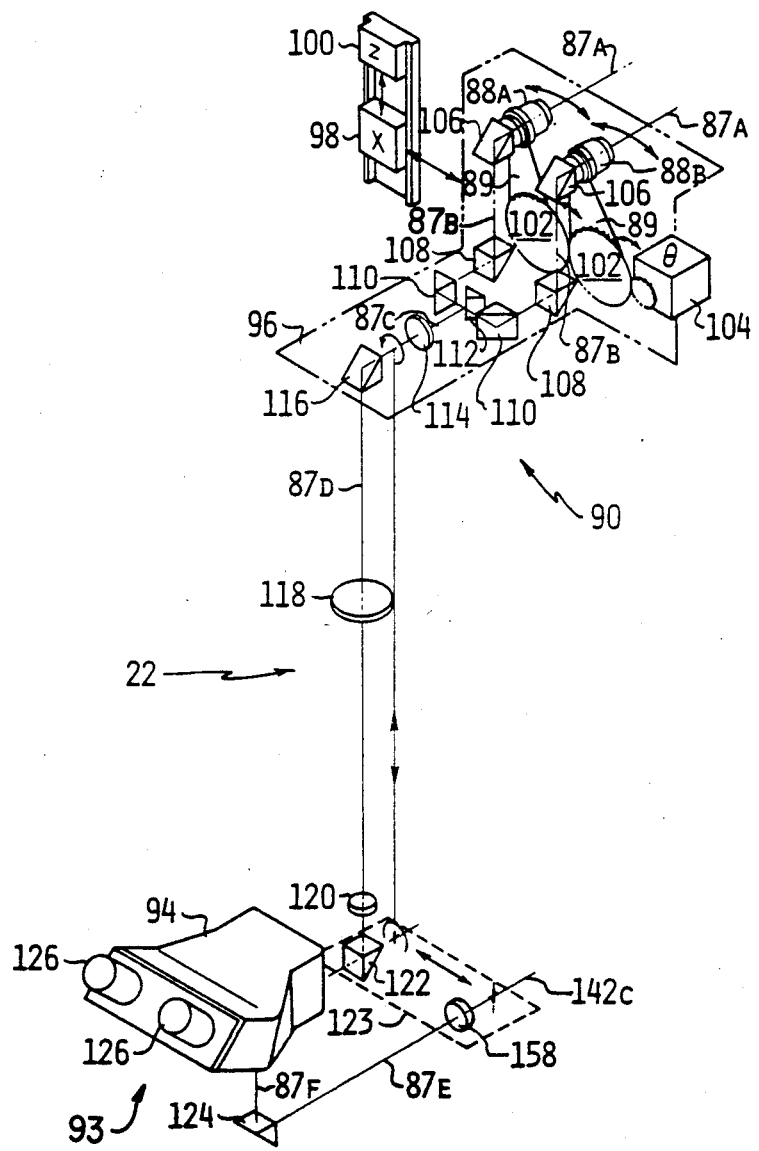

With reference now particularly to FIGS. 1C and 2, compound microscope 22 includes a first objective lens unit 90 employed in the substage adjustment operation being explained and in other precision alignment operations hereinafter explained, a second objective lens unit 92 employed in a precision prealignment operation hereinafter explained, and a binocular lens unit 93 employed with both the first and the second objective lens units as hereinafter explained. The first objective lens unit 90 is mounted on a stage 96 horizontally movable along the X axis under control of an X axis servo drive unit 98 and vertically movable along a Z axis orthogonal to the X and Y axes under control of a Z axis servo drive unit 100. Each of the objective lenses 88a and 88b comprises a 5:1 objective lens mounted on an associated arm 89, which is in turn pivotally mounted on stage 96 and coupled by a gear mechanism 102 to a $\theta$ servo drive unit 104 (both of which are also mounted on stage 96) for moving the objective lenses closer together or further apart. Objective lenses 88a and 88b are disposed along corresponding ones of the horizontally extending portions 87a of dual optical path 87a-f adjacent to the second image plane 79 for receiving light therefrom. Thus, the objective lenses 88a and 88b can be moved with respect to the second image plane 79 as desired for viewing any portion of the aerial image projected to that plane.

A separate beam bender 106 is mounted on each arm 89 along each horizontally extending portion 87a of dual optical path 87a-f for deflecting light passing through the corresponding objective lens 88a or 88b generally downward along a corresponding downwardly extending portion 87b of dual optical path 87a-f to another corresponding beam bender 108. Each beam bender 108 is mounted on the same arm 89 as the corresponding beam bender 106 for pivotal movement therewith as the objective lenses 88a and 88b are moved closer together or further apart. Beam benders 108 are mounted along the corresponding downwardly extending portions 87b of dual optical path 87a-f for deflecting light from the corresponding beam benders 106 along corresponding horizontally extending portions 87c of dual optical path 87a-f to corresponding beam benders 110 from which that light is deflected along other corresponding horizontally extending portions 87c of dual optical path 87a-f to corresponding faces of a split field prism 112. Split field prism 112 in turn deflects light from each beam bender 110 in side-by-side relationship along a common horizontally extending portion 87c of dual optical path 87a-f through a field lens 114 to another beam bender 116. Beam benders 110, split field prism 112, and field lens 114 are fixedly mounted on stage 96 along the respective horizontally extending portions 87c of dual optical path 87a-f.

Beam bender 116 is mounted along the common horizontally extending portion 87c of dual optical path 87a-f for swivel movement thereabout and is disposed for deflecting light passing through field lens 114 downward along a downwardly extending portion 87d of that dual optical path through positive lenses 118 and 120 to a beam bender 122. Positive lenses 118 and 120 and beam bender 122 are mounted along the downwardly extending portion 87d of dual optical path 87a-f for swivel movement with beam bender 116 about the common horizontally extending portion 87c of that dual optical path, and to allow relative axial movement between positive lens 118 (which is fixedly mounted in a first tube 119 in fixed relation to beam bender 116) and positive lens 120 (which is fixedly mounted on a second tube 121 in fixed relation to beam bender 122, the first and second tubes 119 and 121 being slidably and coaxially disposed one within the other) as the length of the downwardly extending portion 87d of the dual optical path is changed by relative movement of beam benders 116 and 122. Thus, the downwardly extending portion 87d of dual optical path 87a-f may be moved by a manually controlled X axis slide 123, on which beam bender 122 is mounted, to locate beam bender 122 in an operative position along a horizontally extending portion 87e of dual optical path 87a-f whenever the first objective lens unit 90 is to be employed with binocular lens unit 93, such as in the substage adjustment operation. In this operative position beam bender 122 deflects light passing through positive lenses 118 and 120 forward along the horizontally extending portion 87e of dual optical path 87a-f to a beam bender 124. This beam bender 124 is fixedly mounted along the horizontally extending portion 87e of dual optical path 87a-f for deflecting light from beam bender 122 upward along a vertically extending portion 87f of dual optical path 87a-f to ocular lenses 126 of binocular head 94, which is fixedly mounted along that portion of the dual optical path.

The various elements of the first objective lens unit 90 and binocular lens unit 93 are arranged along dual optical path 87a-f as described above so that the aerial image viewed are the second image plane 79 by objective lenses 88a and 88b in reimaged at a third image plane 113 directly in front of split field prism 112. Positive lens 118 is provided with a focal length equal to the distance back along dual optical path 87a-f to the third image plane 113, and positive lens 120 is provided with a focal length equal to the distance forward along that dual optical path to a fourth image plane 127 directly in front of ocular lenses 126. Positive lenses 118 and 120 therefore serve as a relay lens unit for reimaging the reimaged image appearing in the third image plane 113 at the fourth image plane 127 and for accommodating changes in the length of the downwardly extending portion 87d of dual optical path 87a-f while transmitting light passing between those positive lenses in parallel rays as required to maintain proper focus.

As shown in FIG. 2 stage 16, beam splitter 21, and projection lens 18 (and, hence, also compensating lens 76) are securely mounted on a tower 2. This tower 2 comprises an upper platform 3 on which stage 16 and beam splitter 21 are mounted, six upright rods 4 on which the upper platform is securely mounted, and a base 5 on which the rods 4 and the projection lens 18 (and, hence, compensating lens 76) are securely mounted. Stage 16, the reticle holder 17 mounted thereon, and the upper platform 3 of tower 2 are provided with clearance openings 6 permitting light passing through the reticle 12 to pass along the vertically extending portion 34e of dual optical path 34a-f through projection lens 18 to whatever object is positioned directly beneath the projection lens. The base 5 of tower 2 is mounted by air bearings on a casting 7, which is in turn fixedly mounted on a granite block 8 on which main stage 20 is mounted as described in U.S. patent application Ser. No. 015,713. Base 5 of tower 2 is vertically movable with respect to the casting 7 (and, hence, granite block 8) so as to permit vertical movement of the tower and, hence, projection lens 18 relative to main stage 20 under control of an automatic focusing system. All of the elements of the first objective lens unit 90 and of the binocular lens unit 93 are securely mounted on an upright portion 9 of casting 7, while all of the elements of the second objective lens unit 92 are securely mounted on an upright portion 10 of the base 5 of tower 2 for vertical movement with the tower. In addition, all of the elements of light source unit 24 shown in FIG. 1B are mounted on an upright post (not shown) which is in turn rotatably mounted on casting 7 so as to permit those elements to be pivoted away from the other portions of alignment and exposure system 10 for ease of service.

Referring now to FIGS. 1A-C and 3, the substage adjustment operation is performed by employing the X and Y servo drive units 25 and 27 for moving main stage 20 so as to position reference mark plate 28 directly beneath projection lens 18 with the end portions (including tic marks 26b) of reference mark 26 (which is nominally oriented along the X axis) illuminated by the projected images of reticle alignment marks 78a and 78b (i.e., by the blue light passing through those reticle alignment marks) contained on reticle 12. Concomitantly, the X and Z axes servo drive units 98 and 100 and the θ servo drive unit 104 are employed for moving stage 96 and spacing objective lenses 88a and 88b of the first objective lens unit 90 so as to position those objective lenses for viewing the aerial images of the illuminated end portions of reference mark 26. Since prior to adjustment of substage 30, reference mark plate 28 is likely disposed adjacent to and intersecting, rather than in, the first image plane 77, both of these aerial images of the illuminated end portions of reference mark plate 28 will be out of focus (one end portion likely being disposed above and the other end portion below the first image plane). While viewing these out-bf-focus aerial images, the operator manually adjusts substage 30 with respect to the plane of main stage 20, and the aforementioned automatic focusing system.

Automatically moves tower 2 so as to track the average pivotal movement of the substage until both of these aerial images are brought into focus. At this point reference mark plate 28 is precisely positioned in and parallel to the first image plane 77, and the aerial images of the end portions of reference mark 26 illuminated by the projected images of reticle alignment marks 78a and 78b contained on reticle 12 are in focus.

Figure 6:
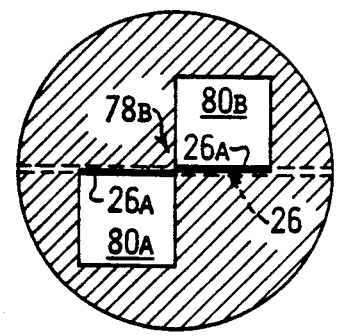
FIG. 6 is a plan view of a portion of a reference mark formed reference mark plate of FIG. 3 as illuminated by a projected image of a reticle alignment mark.

While employing one of the objective lenses of the first objective lens unit (for example, the right hand objective lens 88b) to view one of the focused aerial images (for example, the aerial image of the end portion of reference mark 26 illuminated by the projected image of the right hand reticle alignment mark 78b), the operator employs the X axis servo drive unit 25 for moving main stage 20 back and forth along the X axis in a shuttle mode so as to alternately position each end portion of the reference mark in the projected image of the right hand reticle alignment mark 78b and thereby pass line 26a of the reference mark back and forth through that projected image as shown in FIG. 6. If line 26a of reference mark 26 is not precisely aligned with the X axis of motion of main stage 20, this back-and-forth movement of the main stage causes the illuminated portion of line 26a to rise and fall within the projected image of the right hand reticle alignment mark 78b. The operator thereupon adjusts the angular position of substage 30 until the illuminated portion of line 26a of reference mark 26 does not rise and fall within the projected image of the right hand reticle alignment mark (i.e., remains in the position shown in FIG. 6) as main stage 20 is moved back and forth. This precisely aligns line 26a of reference mark 26 with the X axis of motion of main stage 20 and establishes the reference mark as an absolute frame of reference for precision alignment operations to be performed with alignment and exposure system 10 as hereinafter explained.

A set of n difference reticles 12, each containing a different level of microcircuitry to be successively printed at each of an array of adjacent regions of semiconductive wafer 14 in alignment with other levels of microcircuitry previously printed or yet to be printed at those same regions, is employed in the fabrication of integrated circuits or the like from the semiconductive wafer. Following the substage adjustment operation (and one other set-up operation hereinafter described), alignment and exposure system 10 may be successively employed with each reticle 12 of the set to successively perform each of these step-and-repeat printing operations on every semiconductive wafer 14 of a batch of semiconductive wafers being processed by the alignment and exposure system, as described below. Either the first reticle 12 of the first set of reticles to be employed with alignment and exposure system 10 or a special set-up reticle may be employed to perform the previously-described substage adjustment operation.

During each step-and-repeat printing operation, the reticle 12 being employed must first be precisely aligned with reference mark 26 on substage 30 and, hence, with the X axis of motion of main stage 20. This is accomplished by placing the reticle 12 on vacuum holder 17 of stage 16 in nominal alignment with the X axis of motion of main stage 20; by employing X and Y axes servo drive units 25 and 27 for moving the main stage to a position at which reference mark 26 is centered directly beneath projection lens 18 with the end portions of the reference mark nominally aligned with the images of the reticle alignment marks 78a and 78b of the reticle to be projected onto reference mark plate 28 when shutter 50 is opened; by employing Y axis servo drive unit 66 for moving slide 58 to a position at which mask plate 62 is located in the same operative position between positive lenses 46 and 47 as previously described; by employing θ servo drive unit 51 to open shutter 50 so as to illuminate the reticle alignment marks 78a and 78b on the reticle and, hence, the end portions of reference mark 26 falling within the projected images of those reticle alignment marks; by employing slide 123 for moving beam bender 122 to the operative position in the horizontally extending portion 87e of optical path 87a-f as described above; by employing the X axis, Z axis, and θ servo drive units 98, 100, and 104 to position the objective lenses 88a and 88b for viewing the aerial images of the end portions of reference mark 26 illuminated by the images of the reticle alignment marks 78a and 78b projected onto those end portions; and while viewing those aerial images, by employing the X axis and differential Y axis servo drive units 84, 86a, and 86b for moving reticle 12 to precisely align the images of the reticle alignment marks 78a and 78b contained on the reticle with the illuminated end portions of reference mark 26 as shown in FIG. 7. When so aligned the images of transparent windows 80a and 80b of each reticle alignment mark 78a and 78b are symmetrically disposed with respect to the line 26a and intersecting tic mark 26b of the respective end portion of reference mark 26. It should be noted that many of the foregoing steps of the reticle alignment operation will already have been performed in the case of the first reticle of the first set of reticles being employed with alignment and exposure system 10 if that reticle is initially employed, rather than a special set-up particle, in performing the previously described substage adjustment operation.

Once the first reticle 12 of the set has been aligned with reference mark 26 as described above, a pair of spaced wafer alignment marks 130a and 130b contained on the first reticle is printed on each semiconductive wafer 14 of the batch of semiconductive wafers being processed by alignment and exposure system 10. The wafer alignment marks 130a and 130b printed on semiconductive wafer 14 are employed to precision prealign the semiconductive wafer, as hereinafter explained in preparation for each step-and-repeat printing operation. The same pair of wafer alignment marks 130a and 130b can be employed in preparation for every step-and-repeat printing operation to be formed on semiconductive wafer 14 so long as that pair of wafer alignment marks does not become obliterated or obscured during those step-and-repeat printing operations or other processing operations following each step-and-repeat printing operation. Additional pairs of wafer alignment marks 130a and 130b may also be contained on the first reticle 12 and printed on semiconductive wafer 14 during the same wafer alignment mark printing operation in the event they should later be required.

The wafer alignment marks 130a and 130b contained on the first reticle 12 are spaced 103 millimeters apart and are disposed directly adjacent to and behind reticle alignment marks 78a and 78b. As best shown in FIG. 8, each of these wafer alignment marks 130a and 130 comprises a light or transparent cross (with orthogonal bars 132a and 132b) disposed on a dark or opaque field. In preparation for printing these wafer alignment marks 130a and 130b on each semiconductive wafer 14 of the batch being processed by alignment and exposure system 10, a photosensitive film is deposited over each semiconductive wafer of the batch. The wafer alignment mark printing operation is then successively performed on each semiconductive wafer 14 of the batch in the same manner as will now be described for the first semiconductive wafer of the batch.

The first semiconductive wafer 14 is placed on a vacuum chuck 131 mounted on main stage 20 for differential movement with respect to the plane of the main stage to permit parallel-plane alignment and focusing of the upper surface of the semiconductive wafer in the first image plane 77. The left hand wafer alignment mark 130a contained on the first reticle 12 is printed on the left hand side of the first semiconductive wafer 14 by employing Y axis servo drive unit 66 for moving slide 58 to locate mask plate 62 in an operative position between positive lenses 46 and 47 so as to illuminate small circular portions of the reticle containing the left and right hand wafer alignment marks 130a and 130b with blue light when shutter 50 is subsequently opened; by employing X and Y axes servo drive units 25 and 27 for moving main stage 20 to a position at which the left hand side of the semiconductive wafer is disposed directly beneath projection lens 18 so that when shutter 50 is subsequently opened the left hand wafer alignment mark 130a on the reticle will be imaged onto the left hand side of the semiconductive wafer at a location along a center line 134 thereof parallel to the X axis and at a distance from the center 136 of the semiconductive wafer equal to half the objective spacing of the second objective lens unit 92, while the right hand wafer alignment mark 130b on the reticle will be imaged off and to the left of the semiconductive wafer, as shown in FIG. 9A; and by thereupon momentarily opening shutter 50 so that blue light passing through the aforementioned small circular portion of the reticle containing the left hand wafer alignment mark 130a selectively exposes a corresponding portion of the photosensitive film deposited on the semiconductive wafer and thereby prints that left-hand wafer alignment mark 130a on the semiconductive wafer at the aforementioned location. Similarly, the right hand wafer alignment mark 130b contained on the first reticle 12 is then printed on the right hand side of the first semiconductive wafer 14 by employing X and Y axes servo drive units 25 and 27 for moving main stage 20 to a position at which the right hand side of the semiconductive wafer is disposed directly beneath projection lens 18 so that when shutter 50 is subsequently opened the right hand wafer alignment mark 130b on the reticle will be imaged onto the right hand side of the semiconductive wafer at a location along centerline 134 thereof parallel to the X axis and at a distance from the center 136 of the semiconductive wafer equal to half the objective spacing of the second objective lens unit 92, while the left hand wafer alignment mark 130a on the reticle will be imaged off and to the right of the semiconductive wafer, as shown in FIG. 9B; and by thereupon momentarily opening shutter 50 so that blue light passing through the aforementioned small circular portion of the reticle containing the right hand wafer alignment mark 130b selectively exposes a corresponding portion of the photosensitive film deposited on the semiconductive wafer and thereby prints that right hand wafer alignment mark 130b on the semiconductive wafer at the aforementioned location. Following the foregoing wafer alignment mark printing operation, the first semiconductive wafer 14 is removed from alignment and exposure system 10 and is subsequently processed in accordance with well known techniques to develop the selectively exposed photosensitive film thereon, and, for example, to etch the wafer alignment marks 130a and 130b printed on the semiconductive wafer into the semiconductive wafer.

In initially setting up alignment and exposure system 10 left and right hand prealignment reticles 138a and 138b are manually adjusted (by adjustment screws not shown) to precisely images of left and right hand wafer alignment marks 140a and 140b respectively contained thereon with the X axis of motion of main stage 20 as hereinafter explained. These wafer alignment marks 140a and 140b are identical to reticle alignment marks 78a and 78b contained on reticle 12 but are spaced apart along the X axis in correspondence with the objective spacing of the second objective lens unit 92 and, hence, with the spacing of the wafer alignment marks 130a and 130b previously printed and then etched or otherwise formed on each semiconductive wafer 14. Thus, once a semiconductive wafer 14 has been put back in alignment and exposure system 10 and placed on vacuum chuck 131, it may quickly be precisely aligned with respect to the X axis of motion of main stage 20 and, hence, with respect to reticle 12 by simply employing the X and Y axes servo drive units 25 and 27 for moving the main stage to align the wafer alignment marks 130a and 130b on the semiconductive wafer with the images of the corresponding wafer alignment marks 140a and 140b contained on prealignment reticles 138a and 138b, respectively.

The first semiconductive wafer 14 of the first batch of semiconductive wafers being processed by alignment and exposure system 10 can be used in performing the prealignment reticle adjustment operation. In order to do this the first semiconductive wafer 14 has to be precisely aligned with the image of first reticle 12 of the first set of reticles being employed with alignment and exposure system 10 and, hence, with the X axis of motion of main stage 20 so as to become a secondary frame of reference for use in aligning prealignment reticles 138a and 138b with the X axis motion of the main stage. This is accomplished by placing the first semiconductive wafer 14 on vacuum chuck 131 in nominal alignment with the first reticle 12; by employing the θ servo drive unit 51 to open shutter 50; by employing the Y axis servo drive unit 66 for moving slide 58 to position mask plate 62 at an operative position between positive lenses 46 and 47 so as to illuminate small circular regions of reticle 12 containing the left and right hand reticle alignment marks 78a and 78b as previously described in connection with the substage adjustment and reticle alignment operations; by returning slide 123 and objective lenses 88a and 88b of the first objective lens unit 90 to the positions described above in connection with the reticle alignment operation, if slide 123 and objective lenses 88a and 88b are not already in those positions (however, they should in fact already be in those positions since they do not need to be moved therefrom during alignment of the first reticle of the first set with respect to the reference mark 26 or during subsequent printing of the wafer alignment marks 130a and 130b on the first semiconductive wafer 14); and by employing main stage 20 to perform successive X axis, θ rotational, and Y axis alignments of the wafer alignment marks 130a and 130b on the first semiconductive wafer with respect to the projected images of the illuminated reticle alignment marks 78a and 78b contained on the first reticle.

Figure 10A:
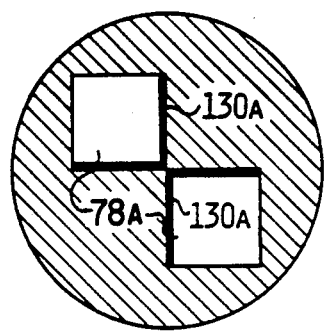
FIG. 10 A–C are plan views illustrating how the pair of wafer alignment marks printed on the semiconductive wafer may be employed in aligning images of a pair of prealignment reticles of the step-and-repeat alignment and exposure system with respect to the reference mark.

The X axis alignment of wafer alignment marks 130a and 130b with respect to the projected images of reticle alignment marks 78a and 78b may be performed by employing the X and Y axes servo drive units 25 and 27 for moving main stage 20 to position the left hand wafer alignment mark 130a directly beneath the projected image of the left-hand reticle alignment mark 78a; by employing the left hand objective lens 88a of the first objective lens unit 90 to view the aerial image of portions of the left hand wafer alignment mark 130a illuminated by the projected image of the left hand reticle alignment mark 78a; and, while viewing that aerial image, by further employing the X and Y axes servo drive units 25 and 27 for moving the main stage to align the left hand wafer alignment mark 130a symmetrically with respect to the projected image of the left hand reticle alignment mark 78a as shown in FIG. 10A. This should normally be effective to complete the X axis alignment of both wafer alignment marks 130a and 130b formed on the first semiconductive wafer with respect to the projected images of the corresponding reticle alignment marks 78a and 78b contained on the first reticle 12.

Figure 10B:
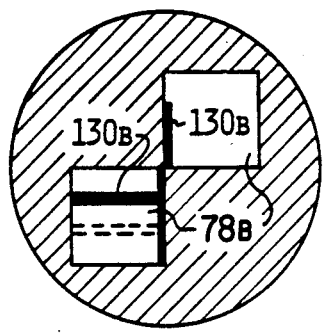

The θ rotation alignment of wafer alignment marks 130a and 130b with respect to the projected images of the reticle alignment marks 78a and 78b may next be performed by employing the X axis servo drive unit 25 for moving main stage 20 to position the right hand wafer alignment mark 130b beneath the projected image of the right hand reticle alignment mark 78b; by employing the right hand objective lens 88b of the first objective lens unit 90 to view the aerial image of portions of the right hand wafer alignment mark 130b illuminated by the projected image of the right hand reticle alignment mark 78b; and, while viewing that aerial image, by employing a θ servo drive unit 29 for rotating vacuum chuck 131 on the main stage to move the right hand wafer alignment mark 130b as shown in FIG. 10B from its original position (indicated in dashed lines) to an intermediate position (indicated in solid lines) approximately half the rotational distance (center-to-center) between its original position and the position of the projected image of the right hand reticle alignment mark 78b. This has the effect of moving both wafer alignment marks 130a and 130b formed on the first semiconductive wafer 14 into nominal θ rotational alignment with the projected images of the corresponding reticle alignment marks 78a and 78b contained on the first reticle 12. Each of these wafer alignment marks 130a and 130b is therefore offset approximately the same distance (center-to-center) along the Y axis from the projected image of the corresponding reticle alignment mark 78a or 78b as may be seen by comparing the intermediate position of the right hand wafer alignment mark 130b (indicated in solid lines in FIG. 10B) relative to the projected image of the right hand reticle alignment mark 78b and the intermediate position of the left hand wafer alignment mark 130a (indicated in solid lines in FIG. 10C) relative to the projected image of the left hand reticle alignment mark 78a.

Figure 10C:
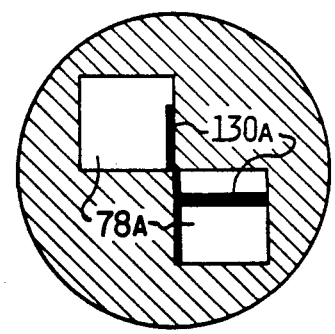

The Y axis alignment of wafer alignment marks 130a and 130b with respect to the projected images of reticle alignment marks 78a and 78b may be performed by employing the X axis servo drive unit 25 for moving main stage 20 to position the left hand wafer alignment mark 130a beneath the projected image of the left hand reticle alignment mark 78a; by employing the left hand objective lens 88a of the first objective lens unit 90 to view the aerial image of the left hand wafer alignment mark 130a illuminated by the projected image of the left hand reticle alignment mark 78a as shown in FIG. 10C; and, while viewing that aerial image, by employing the Y axis servo drive unit 27 and, if necessary, the X axis servo drive unit 25 for moving the main stage to align the left hand wafer alignment mark 130a symmetrically with respect to the projected image of the left hand reticle alignment mark 78a as shown in FIG. 10. This has the effect of moving both wafer alignment marks 130a and 130b formed on the first semiconductive wafer 14 into nominal Y axis alignment with the projected image of the corresponding reticle alignment marks 78a and 78b contained on the first reticle 12.

As mentioned above, the X axis alignment of both wafer alignment marks 130a and 130b formed on the first semiconductive wafer 14 with respect to the projected images of the corresponding reticle alignment marks 78a and 78b contained on the first reticle 12 should be completed at the end of the initial X axis alignment step. However, if any X axis misalignment should remain, it will be observed and can be eliminated while performing the Y axis alignment step. Due to the difficulty of precisely estimating half the rotational distance (center-to-center) between the right-hand wafer alignment mark 130b and the projected image of the corresponding reticle alignment mark 78b during the θ rotational alignment step and due also to the resulting differences in the distances the left and right hand wafer alignment marks 130a and 130b are offset along the Y axis from the projected images of the corresponding reticle alignment marks 78a and 78b (center-to-center), several iterations of the θ rotational and Y axis alignment steps are normally required to complete those alignments. Each such iteration of the θ rotational and Y axis alignment steps should reduce any θ rotational and Y axis misalignments by at least half.

Once the X axis, θ rotational, and Y axis alignments of both wafer alignment marks 130a and 130b on the first semiconductive wafer 14 with respect to the projected images of the corresponding reticle alignment marks 78a and 78b on the first reticle 12 have been completed (i.e., any X axis, θ rotational, and Y axis misalignments have become unobservable with the first objective lens unit 90), the wafer alignment marks 130a and 130b of the first semiconductive wafer are precisely aligned with respect to the X axis of motion of main stage 20. The first semiconductive wafer 14 has therefore become a secondary frame of reference that may now be employed for aligning the wafer alignment marks 140a and 140b contained on prealignment reticles 138a and 138b, respectively, with the X axis of motion of main stage 20 during the prealignment reticle adjustment operation. Accordingly, the X and Y axes servo drive units 25 and 27 are employed for moving main stage 20 to locate the first semiconductive wafer 14 in the prealignment position shown in FIG. 1. In this position the left and right hand wafer alignment marks 130a and 130b on the first semiconductive wafer 14 are disposed beneath the corresponding left and right hand wafer alignment marks 140a and 140b on the left and right hand prealignment reticles 138a and 138b, respectively, and equidistantly along the X axis with respect to the optical axis of projection lens 18. The manner in which the prealignment reticle adjustment operation is performed will now be described with reference to the parts of alignment and exposure system 10 employed in that operation.

With reference now particularly to FIGS. 1A, 1C, 2 and 11 each of the prealignment reticles 138a and 138b is mounted along a corresponding vertically extending portion 142a of a dual optical path 142a-c (on the upright portion 10 of the base 5 of tower 2) for both pivotal movement about and translational movement relative to that portion of dual optical path 142a-c (as manually controlled by adjustment screws not shown) so as to permit alignment of an image of the wafer alignment mark 140a or 140b contained thereon with the corresponding wafer alignment mark 130a or 130b formed on the first semiconductive wafer 14. A separate fiber optical light pipe 144 is fixedly mounted at one end along each of the vertically extending portions 142a of dual optical path 142a-c directly above the corresponding prealignment reticle 138a or 138b. The other end of each of these fiber optic light pipes 144 is optically coupled to a secondary light source 146 of the projection lamp type for emitting illuminating light having a wavelength of 525 nanometers or greater. Illuminating light from this secondary light source 146 passes through fiber optic light pipes 144 and downwardly along the vertically extending portions 142a of dual optical path 142a-c through the corresponding prealignment reticles 138a and 138b.

The second objective lens unit 92 includes a separate beam splitter 148 fixedly mounted along each of the vertically extending portions 142a of dual optical path 142a-c for transmitting fifty percent of the light passing through the corresponding prealignment reticle 138a or 138b downwardly along that portion of dual optical path 142a-c. It also includes left and right hand objective lenses 150a and 150b each comprising a 10:1 objective lens fixedly mounted along a corresponding different one of the vertically extending portions 142a of dual optical path 142a-c directly below the corresponding beam splitter 148. When the first semiconductive wafer 14, or any subsequent semiconductive wafer, is located in the prealignment position shown in FIG. 1, these left and right hand objective lenses 150a and 150b are disposed directly above left and right hand portions of the semiconductive wafer that contain the left and right hand wafer alignment marks 130a and 130b, respectively, since those wafer alignment marks were spaced apart along the X axis by a distance equal to the objective spacing of the second objective lens unit 92 as described above. The left and right hand objective lenses 150a and 150b focus the light passing through the corresponding left and right hand prealignment reticles 138a and 138b and the corresponding beam splitters 148 at the first image plane 77 adjacent to main stage 20 and directly beneath those objective lenses, thereby projecting images of the left and right hand wafer alignment marks 140a and 140b contained on those prealignment reticles onto the corresponding left and right hand wafer alignment mark containing regions of the semiconductive wafer 14 located in the prealignment position. Fifty percent of the light reflected vertically upward from each of these left and right hand wafer alignment mark containing regions of semiconductive wafer 14 through the corresponding objective lens 150a or 150b is reflected by the corresponding beam splitter 148 along a horizontally extending portion 142b of dual optical path 142a-c.

Figure 11:
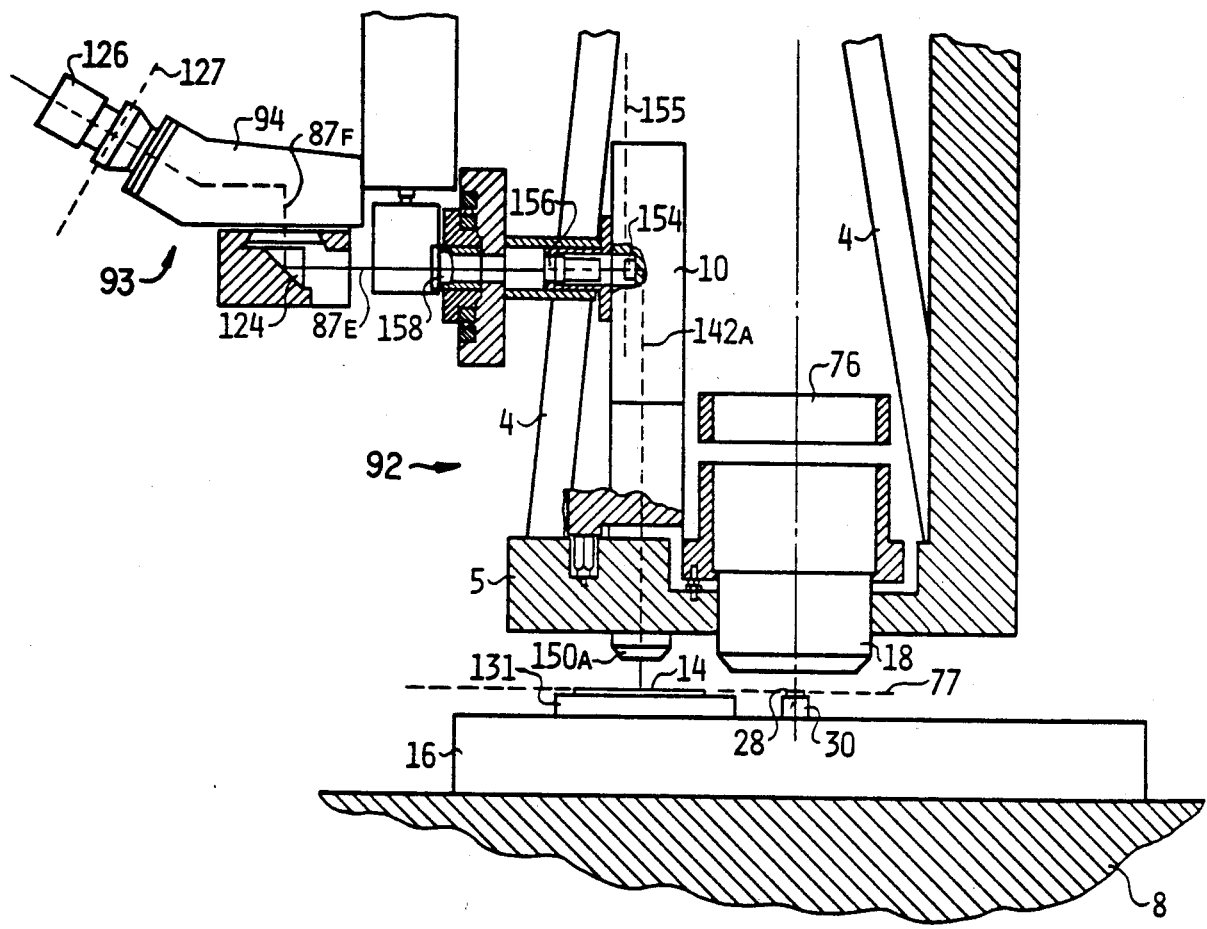
FIG. 11 is a half-sectional elevational view of a portion of the step-and-repeat alignment and exposure system of FIGS. 1A–C.

The second objective lens unit 92 also includes a separate beam bender 152 fixedly mounted along each horizontally extending portion 142b of dual optical path 142a-c adjacent to the corresponding beam splitter 148 so as to deflect the reflected light therefrom to a corresponding face of a split field prism 154. Split field prism 154 is fixedly mounted along both horizontally extending portions 142b of dual optical path 142a-c as to deflect the reflected light from each beam bender 152 in side-by-side relationship along a common horizontally extending portion 142c of dual optical path 142a-c to a fifth image plane 155 positioned directly in front of split field prism 154 and the same optical distance from beam splitters 148 as are prealignment reticles 138a and 138b. A 5:1 objective lens 156 is fixedly mounted along the common horizontally extending portion of dual optical path 142a-c for viewing the fifth image plane 155. The horizontally extending portion 142c of dual optical path 142a-c is axially aligned with the horizontally extending portion 87e of dual optical path 87a-f to permit use of the first and second objective lens units 90 and 92 with the same binocular lens unit 93 as determined by the position of slide 123. Accordingly, a positive lens 158 is fixedly mounted on slide 123 for movement into an operative position in those axially aligned horizontally extending portions 87e and 142c of dual optical paths 87a-f and 142a-c between beam bender 124 and objective lens 156, as shown in FIGS. 1C and 11, when the second objective lens unit 92 is to be employed. With positive lens 158 so positioned, light from objective lens 156 passes through positive lens 158 and along horizontally extending portion 87e of dual optical path 87a-f to beam bender 124 from which it is deflected upward along vertically extending portion 87f of dual optical path 87a-f to the fourth image plane 127 directly in front of ocular lenses 126 of binocular head 94.

The various elements of the second objective lens unit 92 are arranged along dual optical path 142a-c as described above so that objective lenses 150a and 150b focus the light reflected from the left and right hand wafer alignment mark containing regions of the semiconductive wafer 14 disposed in the prealignment position at the fifth image plane 155 directly in front of split field prism 154. This provides aerial images of the left and right hand wafer alignment marks 130a and 130b disposed on the semiconductive wafer in the first image plane 77 directly beneath objective lenses 150a and 150b, and of the images of the corresponding left and right hand wafer alignment marks 140a and 140b contained on the prealignment reticles 138a and 138b and projected onto the semiconductive wafer directly beneath those objective lenses, in the fifth image plane 155. Objective lens 156 has a focal length equal to the distance from its input pupil back along the horizontally extending portion 142c of dual optical path 142a-c to the fifth image plane. Positive lens 158, when positioned in the axially aligned horizontally extending portions 87e and 142c of dual optical paths 87a-f and 142a-c, has a focal length equal to the distance forward along portions 87e and 87f of dual optical path 87a-f to the fourth image plane 127 directly in front of ocular lenses 126 of binocular head 94. Objective lens 156 and positive lens 158 therefore reimage the aerial images provided in the fifth image plane 155 at the fourth image plane 127.

Figure 12:
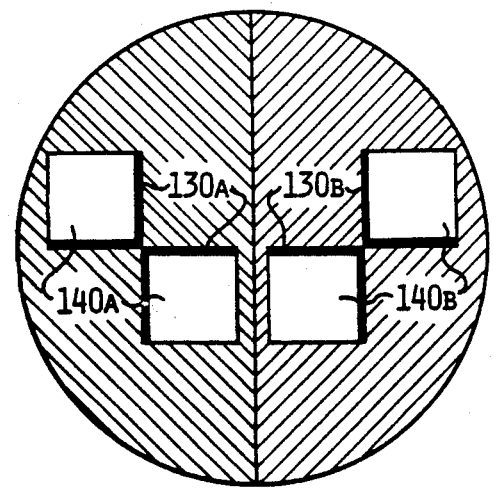
FIG. 12 is a plan view of the pair of wafer alignment marks printed on the semiconductive wafer when they are precision prealigned with images of the pair of prealignment reticles.

The prealignment reticle adjustment operation may therefore be performed by employing slide 123 to move positive lens 158 into the operative position in the axially aligned horizontally extending portions 87e and 142c of dual optical paths 87a-f and 142a-c; by thereupon employing binocular lens unit 93 with the second objective lens unit 92 to view the aerial images of those portions of the left and right hand wafer alignment marks 130a and 130b disposed on the first semiconductive wafer 14 that are illuminated by the projected images of the corresponding wafer alignment marks 140a and 140b disposed on prealignment reticles 138a and 138b; and, while viewing those aerial images, by manually adjusting the prealignment reticles to position the projected images of the left and right hand wafer alignment marks 140a and 140b disposed thereon in precise θ rotational, X axis, and Y axis alignment with the corresponding left and right hand wafer alignment marks 130a and 130b disposed on the first semiconductive wafer as shown in FIG. 12. This precisely aligns the prealignment reticles 138a and 138b with the X axis of motion of main stage 20 and positions them equidistantly along the X axis with respect to the optical axis of projection lens 18 so that they may subsequently be employed in the precision prealignment of other semiconductive wafers 14 without further adjustment. Although the prealignment reticle adjustment operation should not normally have to be repeated during the lifetime of alignment and exposure system 10, it may be checked at any time by employing another semiconductive wafer in the same manner as described above for the first semiconductive wafer.

Each semiconductive wafer 14 processed by alignment and exposure system 10 subsequent to the prealignment reticle adjustment operation, may be precision prealigned with respect to the X axis of motion of main stage 20 and with respect to the optical axis of projection lens 18 by simply employing the X and Y axes servo drive units 25 and 27 for moving main stage 20 to position the semiconductive wafer in the prealignment position shown in FIG. 1; by moving slide 123 to move positive lens 158 to the operative position; by employing binocular lens unit 93 to view the aerial images provided by the second objective lens unit 92 as described above; and, while viewing those aerial images, by employing the X axis, Y axis, and θ servo drive units 25, 27, and 29 for moving the main stage and rotating vacuum chuck 17 to precisely align the left and right hand wafer alignment marks 130a and 130b formed on the semiconductive wafer with images of the corresponding left and right hand wafer alignment marks 140a and 140b contrained on the prealignment reticles 138a and 138b. Following the precision prealignment of a semiconductive wafer 14 it may be subjected to a step-and-repeat printing operation in the same manner as described below for the first semiconductive wafer 14.

Figure 13:
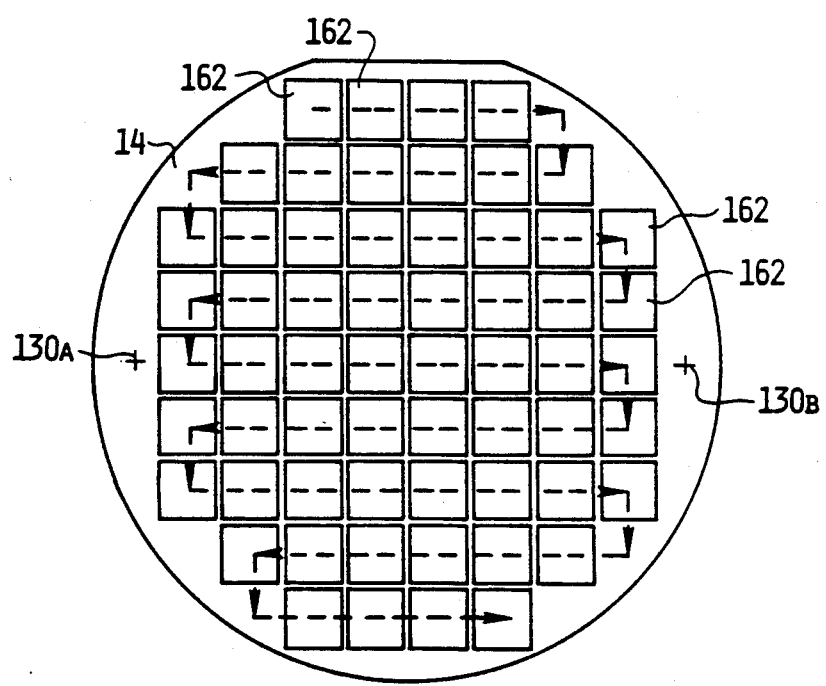
FIG. 13 is a plan view of the semiconductive wafer illustrating the manner in which a step-and-repeat printing operation is performed by the step-and-repeat alignment and exposure system of FIGS. 1A–C.

Assuming that the first reticle 12 of the first set of reticles being employed with and the first semiconductive wafer 14 of the first batch of semiconductive wafers being processed by alignment and exposure system 10 were employed to perform the previously-described prealignment reticle adjustment operation (rather than a special set-up reticle and a special set-up wafer), the first semiconductive wafer is then removed from alignment and exposure system 10 so that a photosensitive film may be deposited over the first semiconductive wafer along with the other semiconductive wafers of the same batch. The first semiconductive wafer 14 is thereafter placed back in alignment and exposure system 10 on vacuum chuck 17 and precision prealigned with prealignment reticles 138a and 138b as described above. Referring again to FIGS. 1A–C and 2, the first level of microcircuitry contained on a central portion 160 of the first reticle may now be printed at each of a desired array of adjacent regions 162 of the first semiconductive wafer as shown in FIG. 13. This is accomplished by employing the Y axis servo drive unit 66 for moving slide 58 to position mask plate 60 in an operative position between positive lenses 46 and 47 with a square central opening 69 of mask plate 60 permitting illumination of the entire microcircuitry-containing central portion 160 of the first reticle 12 held by vacuum holder 17 when shutter 50 is moved to the open position shown in dashed lines in FIG. 1; by employing the X and Y axes servo drive units 25 and 27 to step main stage 20 so as to successively position each of the desired array of adjacent regions 162 of the first semiconductive wafer 14 held by vacuum chuck 131 directly beneath projection lens 18 in the order indicated by the dashed arrows in FIG. 13; and by employing the θ servo drive unit 51 to momentarily move shutter 50 to the open position when each of those regions 162 of the first semiconductive wafer is so positioned, thereby repetitively selectively exposing the photosensitive film deposited on the first semiconductive wafer so as to print the first level of microcircuitry contained on the first reticle at each of those regions of the first semiconductive wafer. The square central opening 69 of mask plate 60 is of a size for permitting illumination of the entire microcircuitry-containing central portion 160 of each reticle 12 (an area of about 100 millimeters or less square) as described above, while preventing illumination and, hence, printing of the reticle alignment marks 78a and 78b and any wafer alignment marks 130a and 130b contained on the reticle, during the step-and-repeat printing operation.

Following this step-and-repeat printing operation, the first semiconductive wafer 14 is removed from alignment and exposure system 10 and processed to develop the selectively exposed photosensitive film thereon and to selectively etch, diffuse, plate, implant or otherwise process the first semiconductive wafer in accordance with well known techniques for forming the first level of microcircuitry on the first semiconductive wafer at each of the desired array of adjacent regions 162. Each additional semiconductive wafer 14 of the first batch and every semiconductive wafer of every other batch to be processed by alignment and exposure system 10 may also be processed with the first reticle 12 (and possibly a second reticle as hereinafter explained) of the aforementioned set or any other set of reticles in exactly the same manner as described above in connection with the first semiconductive wafer of the first batch (except for the prealignment reticle adjustment operation) to initially print and form the left and right hand wafer alignment marks 130a and 130b (and possibly other alignment marks as hereinafter explained) on the semiconductive wafer and then to step-and-repeatedly print the first level of microcircuitry contained on the first reticle (or a second reticle as hereinafter explained) of the set of reticles at each of the desired array of adjacent regions of the semiconductive wafer. In this case each semiconductive wafer 14 is removed from alignment and exposure system 10 following the initial alignment mark printing operation to form the alignment marks on the semiconductive wafer, for example, by a deep etching operation, is then placed back in the alignment and exposure system and precision prealigned in preparation for the subsequent first step-and-repeat microcircuitry printing operation, and is removed again from the alignment and exposure system following the first step-and-repeat microcircuitry printing operation to form the first level of microcircuitry on the semiconductive wafer.

Alternatively, however, in cases where the steps of forming the wafer alignment marks and the first level of microcircuitry on a semiconductive wafer 14 (other than the first semiconductive wafer employed to perform the prealignment reticle adjustment operation) do not require inconsistent processing, such as different depths of etching, it is not necessary to remove the semiconductive wafer from alignment and exposure system 10 between the initial wafer alignment mark printing operation and the first step-and-repeat microcircuitry printing operation (the wafer alignment marks 130a and 130b then printed on the semiconductive wafer not being required for the prealignment reticle adjustment operation or for alignment of the first level of microcircuitry with a previously formed level of microcircuitry). In such cases the first step-and-repeat printing operation can be performed to print the first level of microcircuitry contained on the first reticle of the set at each of the desired array of adjacent regions 162 of the semiconductive wafer without first performing the precision prealignment operation. Upon completion of the first step-and-repeat printing operation, the semiconductive wafer 14 is removed for the first time from alignment and exposure system 10 and processed as previously indicated to form the wafer alignment marks 130a and 130b (and any other wafer alignment marks that may have also been printed as hereinafter described) on the semiconductive wafer and also to form the first level of microcircuitry at each of the desired array of adjacent regions 162 of the semiconductive wafer.

Once the first level of microcircuitry contained on the first reticle 12 (or the second reticle as hereinafter described) of the set of reticles being employed with alignment and exposure system 10 has been printed and formed on each of the desired array of adjacent regions 162 of each semiconductive wafer 14 of the batch or batches being processed with the alignment and exposure system, that reticle is removed from the vacuum holder 17 of stage 16. The next reticle 12 of the set is then placed on the vacuum holder 17 of stage 16 in nominal alignment with the X axis of motion of main stage 20 and is thereupon precisely aligned with respect to the X axis of motion in exactly the same manner as previously described for the first reticle of the set (i.e., by employing the X and Y axes servo drive units 25 and 27 for moving the main stage to position reference mark 26 directly beneath projection lens 18; by employing Y axis servo drive unit 66 for moving slide 58 to position mask plate 62 in an operative position between positive lenses 46 and 47 so as to illuminate the reticle alignment marks 78a and 78b on the reticle when shutter 50 is opened; by employing θ servo drive unit 51 to open shutter 50; by employing slide 123 to move beam bender 122 into the operative position in the horizontally extending portion 87e of dual optical path 87a-f and thereby permit use of the first objective lens unit 90 with binocular lens unit 93 for viewing the aerial images of the end portions of reference mark 26, which are illuminated by the projected images of the reticle alignment marks 78a and 78b; by employing the X axis, Z axis and θ servo drive units 98, 100 and 104 to position objective lenses 88a and 88b for viewing those aerial images; and, while viewing those aerial images, by employing the X axis and differential Y axis servo drive units 84, 86a and 86b for moving stage 16 so as to precisely align the projected images of the reticle alignment marks 78a and 78b with the illuminated end portions of reference mark 26 as previously shown in FIG. 7).

The second level of microcircuitry contained on this next reticle 12 of the set is thereupon printed and formed at each of the desired array of adjacent retions 162 on each semiconductive wafer 14 of the batch being processed by alignment and exposure system 10 in alignment with the first level of microcircuitry previously printed and formed at each of those regions on each of those semiconductive wafers. This is accomplished for each of those semiconductive wafers 14 by depositing a photosensitive film over the semi-conductive wafer; by placing the semiconductive wafer back in alignment and exposure system 10 on vacuum chuck 13 in nominal alignment with the X axis of motion of main stage 20; by precision prealigning the semiconductive wafer in exactly the same manner as previously described for the first semiconductive wafer being processed by the alignment and exposure system (i.e., by employing the X and Y axes servo drive units 25 and 27 for moving the main stage to locate the semiconductive wafer in the prealignment position; by employing slide 123 to move positive lens 158 into the operative position in the axially aligned horizontally extending portions 87e and 142c of dual optical paths 87a-f and 142a-c and thereby permit use of the second objective lens unit 92 with binocular lens unit 93 for viewing the aerial images of the left and right hand wafer alignment marks 130a and 130b disposed on the semiconductive wafer and illuminated by the projected images of the corresponding left and right hand wafer alignment marks 140a and 140b disposed on the prealignment reticles 138a and 138b and, while viewing those aerial images, by employing the X axis, Y axis, and θ servo drive units 25, 27, and 29 for moving the main stage and rotating the vacuum chuck so as to precisely align the left and right hand wafer alignment marks 130a and 130b on the semi-conductive wafer with the projected images of the corresponding left and right hand wafer alignment marks 140a and 140b on the prealignment reticles); by then step-and-repeat printing the second level of microcircuitry contained on the central portion 160 of the reticle at each of the same desired array of adjacent regions 162 of the semiconductive wafer in exactly the same manner as also previously described for the first semiconductive wafer being processed by the alignment and exposure system (i.e., by employing the Y axis servo drive unit 66 for moving slide 58 so as to position mask plate 60 in an operative position between positive lenses 46 and 47 and thereby illuminate the entire microcircuitry-containing central portion 160 of the reticle when shutter 50 is opened; by employing the X and Y axes servo drive units 25 and 27 for stepping the main stage to successively position each of the same desired array of adjacent regions 162 of the semiconductive wafer directly beneath projection lens 18 in the same order as before; and by employing the θ servo drive unit 51 to momentarily open shutter 50 when each of those regions 162 of the semiconductive wafer is so positioned and thereby repetitively selectively expose the photosensitive film deposited on the semiconductive wafer so as to print the second level of microcircuitry contained on the reticle at each of those regions 162 of the semiconductive wafer); by thereupon removing the semiconductive wafer from the alignment and exposure system; and by subsequently processing the semiconductive wafer to develop the selectively exposed photosensitive film thereon and form the second level of microcircuitry at each of the same desired array of adjacent regions 162 of the semiconductive wafer.

The foregoing reticle alignment, wafer alignment, printing, and processing operations are repeated for each remaining reticle 12 of the set of reticles being employed with alignment and exposure system 10 in processing each semiconductive wafer 14 of the batch of semiconductive wafers being processed by the alignment and exposure system so as to print and form each successive level of microcircuitry contained on those reticles at each of the same desired array of adjacent regions 162 on each of those semiconductive wafers in alignment with the levels of microcircuitry previously formed at each of those same regions on each of those semiconductive wafers. Following completion of this processing each semiconductive wafer 14 is typically scribed alongside each row and column of the desired array of adjacent regions 162 of the semiconductive wafer so as to form a plurality of individual die each containing one of the regions 162. These dice are then typically subjected to die bonding, wire bonding, and other well known processing operations to form integrated circuits or the like.

Figure 14:
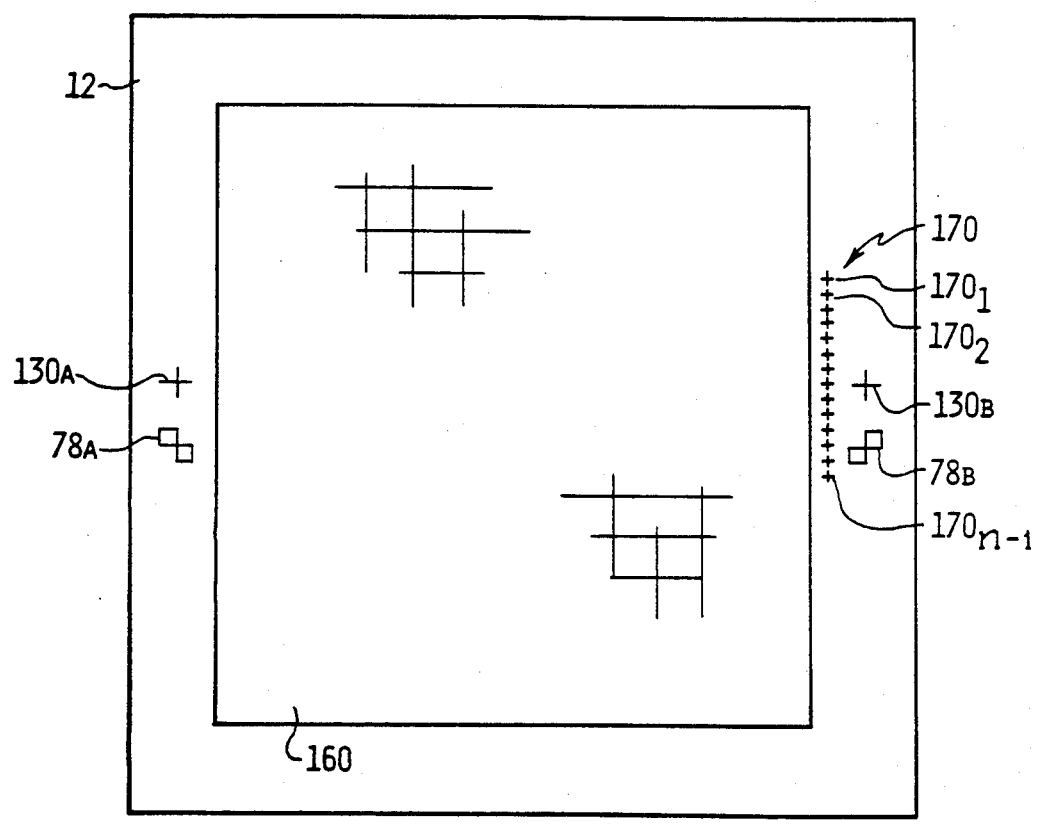
FIGS. 14 and 15 are plan views of portions of first and second reticles of a set of reticles employed with the step-and-repeat alignment and exposure system of FIGS. 1A–C.

Alignment and exposure system 10 may also be used to perform a precision alignment step-and-repeat printing operation permitting each level of microcircuitry to be successively printed at each of the same desired array of adjacent regions 162 of each semiconductive wafer 14 in even more precise alignment with any level or levels of microcircuitry previously printed and formed at each of those same regions than could otherwise be achieved with the aid of the above-identified prealignment operation alone. In order to perform this precision alignment step-and-repeat printing operation, the first reticle 12 of the set of reticles being employed with alignment and exposure system 10 is also provided, as shown in FIG. 14, with a set of small wafer alignment marks 170 vertically arranged in a column, for example, in the marginal portion of the first reticle along the Y axis (assuming the first reticle is held by vacuum holder 17 of stage 16 in alignment with the X axis of motion of main stage 20 as previously described) and between one side of the microcircuitry-containing portion 160 of the first reticle and the reticle and wafer alignment marks 78b and 130b also contained on the first reticle. These small wafer alignment marks 170 lie within the square area of the first reticle illuminated when mask plate 60 is disposed in its operative position between positive lenses 46 and 47 and shutter 50 is opened (as during the above-described step-and-repeat printing operation). The small wafer alignment marks 170 may comprise crosses of the same type as the wafer alignment marks 130a and 130b (i.e., light or transparent lines oriented parallel to those of wafer alignment marks 130a and 130b and disposed on a dark or opaque field), but are substantially smaller and are equal in number to the n−1 remaining reticles of the set. In the case where the set of small wafer alignment marks 170 is contained on the first reticle 12 of the set along with the first level of microcircuitry, the set of small wafer alignment marks 170 is automatically printed with and alongside each of the desired array of adjacent regions 162 of the semiconductive wafer 14 during the first step-and-repeat printing operation performed on the semiconductive wafer. The sets of small wafer alignment marks 170 so printed may be formed alongside each of the desired array of adjacent regions 162 of the semiconductive marker 14, for example, by an etching operation performed during subsequent processing of the semiconductive wafer to form the first level of microcircuitry at each of those regions.

Alternatively, however, in a case where it is desired to form the left and right hand wafer alignment marks 130a and 130b and the set of smaller wafer alignment marks 170, for example, by a deeper etching operation than may be desired in forming the first level of microcircuitry, the left and right hand wafer alignment marks 130a and 130b and the set of smaller wafer alignment marks 170 may be provided on the first reticle 12 of the set in the same positions shown in FIG. 14 and the first level of microcircuitry may be provided on the central portion 160 of the second reticle of the set in the same position shown in FIGS. 1A and 14. In such a case, the set of small wafer alignment marks 170 may then be printed alongside as many of the desired array of adjacent regions 162 of the semiconductive wafer 14 (ranging from a minimum of, for example, one of those regions per quadrant of the semiconductive wafer to a maximum of, for example, all of those regions) as deemed appropriate by the operator. This may be done immediately following the previously-described operation of printing the left and right hand wafer alignment marks 130a and 130b contained on the first reticle 12 of the set onto the semiconductive wafer 14. The small wafer alignment mark printing operation is performed by employing the Y axis servo drive unit 66 for moving slide 58 to position mask plate 60 in its operative position between positive lenses 46 and 47 and thereby illuminate the entire central portion 160 of the reticle 12 and the set of small wafer alignment marks 170 (but not the reticle alignment marks 78a and 78b or the wafer alignment marks 130a and 130b) when shutter 50 is opened; by employing the X and Y axes servo drive units 25 and 27 for stepping main stage 20 to successively position selected ones of the regions 162 alongside which the operator desires to print the set of small wafer alignment marks 170 (such as, for example, a selected one of those regions per quadrant of the semiconductive wafer), directly beneath projection lens 18; and by employing the θ servo drive unit 51 to momentarily open shutter 50 when each of those selected regions 162 of the semiconductive wafer is so positioned and thereby repetitively selectively expose the photosensitive film deposited on the semiconductive wafer so as to print the entire set of smaller wafer alignment marks 170 contained on the first reticle alongside each of those selected regions 162 on the semiconductive wafer. The right and left hand wafer alignment marks 130a and 130b and the sets of smaller wafer alignment marks 170 so printed may thereupon be formed on the semiconductive wafer 14 by removing the semiconductive wafer from alignment and exposure system 10 for the first time; and by subsequently processing the semiconductive wafer to develop the selectively exposed photosensitive film thereon and, for example, to simultaneously deeply etch all of those wafer alignment marks into the semiconductive wafer at the locations where they were printed.

Figure 15:
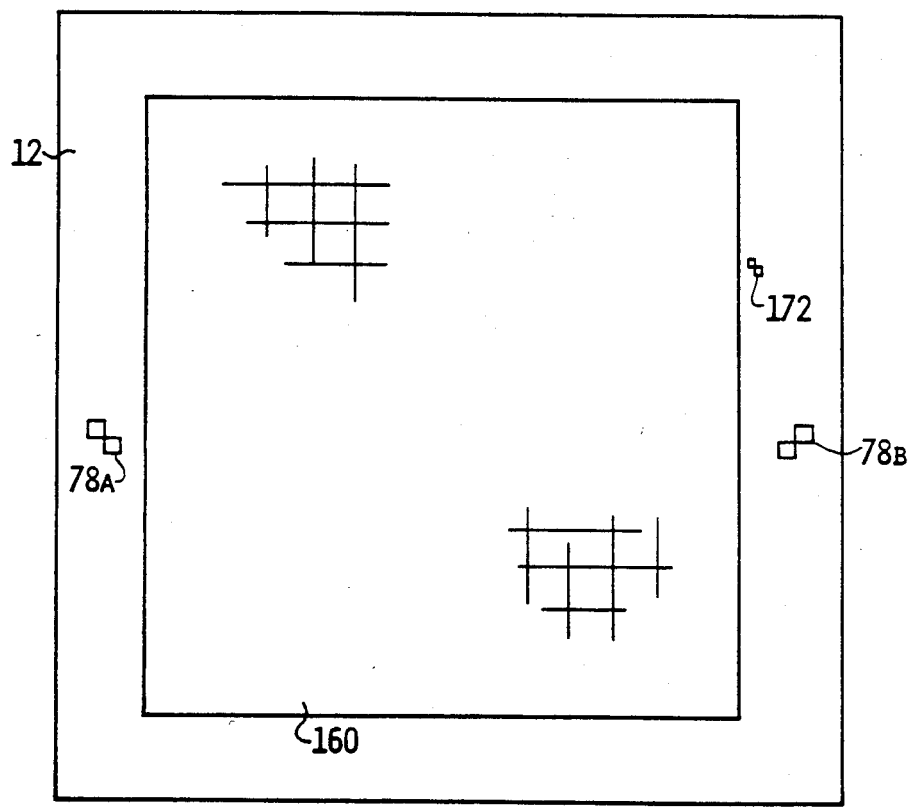

Following the wafer alignment mark printing and forming operations in either of the foregoing cases, the first reticle 12 is removed from alignment and exposure system 10. The second reticle 12 of the set is then placed, on vacuum holder 17 of stage 16 in nominal alignment with the X axis of motion of main stage 20 and is thereupon precisely aligned with the X axis of motion in exactly the same manner as previously described. This second reticle 12 is provided as shown in FIG. 15, with a small wafer alignment mark 172 in the marginal portion thereof along the Y axis (once the second reticle is aligned with the X axis of motion of main stage 20) between reticle alignment mark 78b and one side of the microcircuitry-containing central portion 160 (which contains the second level of microcircuitry in the first-mentioned case and the first level of microcircuitry in the second-mentioned case). The small wafer alignment mark 172 is disposed at the same position on the second reticle 12 as a corresponding first one of the set of n−1 small wafer alignment marks 170 contained on the first reticle and is therefore illuminated with the microcircuitry-containing portion 160 of the second reticle when mask plate 60 is disposed in its operative position between positive lenses 46 and 47 and shutter 50 is opened. The small wafer alignment mark 172 may comprise a pair of square windows and of the same type as the reticle alignment mark 78a or (i.e., a pair of light or transparent windows symmetrically oriented about the center of the wafer alignment mark on opposite sides of a pair of orthogonal centerlines thereof and disposed on a dark or opaque field), but is substantially smaller (being of about the same size as one of the small wafer alignment marks 170 contained on the first reticle). An identical small wafer alignment mark 172 is also provided in the same manner on each of the succeeding reticles 12 of the set, but at the same position as the corresponding succeeding one of the set of n−1 small wafer alignment marks 170 contained on the first reticle. Thus, the first through the last small wafer alignment marks 172 provided on the second through the nth reticles 12 of the set of n reticles corresponds to the first through the last small wafer alignment marks $170_1$, $-170_{n-1}$, respectively, of the set of n−1 small wafer alignment marks 170 printed and formed alongside each of the selected regions 162 of the semiconductive wafer 14 (the subscripts 1 through n−1 hereinafter being used when referring specifically to the first through the last wafer alignment marks, respectively, of a set of n−1 small wafer alignment marks 170 formed on the semiconductive wafer).

The manner in which the precision alignment step-and-repeat printing operation is performed will now be described with reference to the parts of alignment and exposure system 10 employed in that operation. As shown in FIG. 1B, a first end of a fiber optic light pipe 174 is fixedly mounted along a horizontally extending optical path 175 axially aligned with the horizontally extending portion 34d of optical path 34a−e. A second end of this fiber optic light pipe 174 is fixedly mounted adjacent to a blue filter at a corresponding opening in elliptical reflector 36. A beam of blue illuminating and exposure light from mercury arc lamp 32 therefore passes through fiber optic light pipe 174 and along the horizontally extending optical path 175. A normally closed shutter 176 pivotally mounted adjacent to the horizontally extending optical path 175 is pivoted into that optical path (as shown in solid lines) when closed so as to block passage of the beam of light therealong and is pivoted out of that optical path (as shown in dashed lines) when opened so as to permit passage of the beam of light therealong. These pivotal movements of shutter 176 are controlled by a θ servo drive unit 177 coupled thereto.

The first end of fiber optic light pipe 174, the shutter 176, the θ servo drive unit 177, and a mask plate 182 are all mounted on a stage 178 for movement therewith along the X and Z axes. Stage 178 is moved along the X and Z axes by X and Z axes servo drive units 179 and 181 to selectively position mask plate 182 in a vertical plane orthogonally intersecting the horizontally extending optical path 175 at a point midway between fiber optic light pipe 174 and a positive lens 184. Mask plate 182 has a small circular opening 186, for permitting the beam of light passing along the horizontally extending optical path 175, when shutter 176 is opened, to illuminate a corresponding circular area located on the second or any succeeding reticle 12 (held by vacuum holder 17 of stage 16) and containing one (and only one) of the small wafer alignment marks 172 disposed on that reticle. Positive lens 184 is fixedly mounted in the horizontally extending optical path 175 so as to project light passing through the small circular opening 186 in mask plate 182 to the entrance pupil of imaging lens 56. Beam splitter 48 transmits twenty percent of the light passing through positive lens 184 forward along the horizontally extending portion 34d of optical path 34a−e. This light thereupon passes along the remainder of optical path 34a−e and along dual optical path 87a−f in the same manner as previously described in connection with the substage adjustment operation so that the first objective lens unit 90 may be used with binocular lens unit 93, as hereinafter described, to view an aerial image of one of the small wafer alignment marks 170 on the semiconductive wafer 14, when that small wafer alignment mark is positioned directly beneath projection lens 18 and illuminated by a projected image of the corresponding small wafer alignment mark 172 disposed on the second or one of the succeeding reticles of the set.

Once the set of small wafer alignment marks 170 has been formed on the semiconductive wafer 14 alongside each of the selected regions 162 thereof, a photosensitive film is deposited over the semiconductive wafer (this is typically done at one time with the other semiconductive wafers of the batch). The semiconductive wafer 14 is then put back in alignment and exposure system 10 on vacuum chuck 131 in nominal alignment with the X axis of motion of main stage 20. It is thereupon precision prealigned with respect to prealignment reticles 138a and 138b in exactly the same manner as previously described. In preparation for the precision alignment step-and-repeat printing operation, the X and Z axes servo drive units 179 and 181 are employed for moving stage 178 so as to position mask plate 182 for illuminating only the small wafer alignment mark 172 on the second reticle 12, when shutter 176 is subsequently opened. Additionally, slide 123 is employed to move beam bender 122 into the operative position in the horizontally extending portion 87e of dual optical path 87a−f so that binocular lens unit 93 may be used with the first objective lens unit 90 to view an aerial image of the first small wafer alignment mark $170_1$ alongside a
selected region 162 of the semiconductive wafer 14 and of the image of the corresponding small wafer alignment mark 172 on the second reticle 12 when shutter 176 is opened.

The precision alignment step-and-repeat printing operation may now be performed by employing the X and Y axes servo drive units 25 and 27 for stepping main stage 20 to position the selected region 162 in the first quadrant of the semiconductive wafer 14 directly beneath projection lens 18, thereby positioning the first small wafer alignment mark $170_1$ disposed alongside that selected region in nominal alignment with the image of the corresponding small wafer alignment mark 172 (on the second reticle) to be projected onto the semiconductive wafer when the shutter 176 is subsequently opened; by thereupon employing the θ servo drive unit 177 for moving shutter 176 to the open position (shown in dashed lines) whereupon mask plate 182 illuminates the small wafer alignment mark 172 contained on the second reticle without illuminating either of the larger reticle alignment marks 78a and 78b or the microcircuitry-containing central portion 160 of the second reticle; by employing the first objective lens unit 90 with binocular lens unit 93 to view the aerial image of the first small wafer alignment mark $170_1$ disposed alongside the selected region 162 in the first quadrant of the semiconductive wafer and illuminated by the projected image of the corresponding wafer alignment mark 172 contained on the second reticle; while viewing that aerial image, by employing the X and Y axes servo drive units 25 and 27 for moving the main stage so as to precisely align that first small wafer alignment mark $170_1$ in the first quadrant of the semiconductive wafer with the projected image of the corresponding small wafer alignment mark 172 on the second reticle; by measuring and storing the offset distances the main stage is moved along the X and Y axes to move the first small wafer alignment mark $170_1$ in the first quadrant of the semiconductive wafer from its initial nominally aligned position to its final precisely aligned position relative to the projected image of the corresponding small wafer alignment mark 172 on the second reticle (this may be done, for example, by simply employing the counters and the computer of the X and Y axes position control circuits disclosed in the aforementioned U.S. patent application Ser. No. 015,713 and used for controlling an interferometrically-controlled stage such as main stage 20); by employing the $\theta$ servo drive unit 177 to move shutter 176 to the closed position (shown in solid lines), thereby blocking the passage of light through mask plate 182 to the second reticle; by repeating each of the preceding steps of this paragraph in exactly the same manner for the first small wafer alignment mark $170_1$ formed alongside the selected region 162 in each of the remaining quadrants of the semiconductive wafer (i.e., for each of the small wafer alignment marks 170 formed on the semiconductive wafer and associated with the second reticle); by employing the four resultant pairs of offset distances (or values) along the X and Y axes to determine the manner in which the main stage should be moved along the X and Y axes during the following step-and-repeat printing operation to best fit those determined pairs of offset values while succesively printing the level of microcircuitry contained on the second reticle at each of the desired array of adjacent regions 162 on the semiconductive wafer (this may be done, for example, by employing the above-mentioned computer to compute corrected coordinates or pairs of X and Y axes end points, in accordance with well known best fit equations for X and Y axes coordinate systems, for each of the positions to which the main stage is to be stepped during the following step-and-repeat printing operation); and by then step-and-repeat printing the level of microcircuitry contained on the central portion 160 of the second reticle at each of the desired array of adjacent regions 162 of the semiconductive wafer in exactly the same manner as previously described, but utilizing the corrected coordinates (or pairs of X and Y axes end points) to determine each of the positions to which the main stage is moved during that step-and-repeat printing operation (this may be done by employing the aforementioned computer controlled X and Y axes position control circuits disclosed in the U.S. patent application Ser. No. 015,713 to drive the X and Y axes servo drive units 25 and 27 for the main stage).

During the foregoing precision alignment step-and-repeat printing operation, the level of microcircuitry contained on the central region 160 of the second reticle 12 is successively printed at each of the desired array of adjacent regions 162 on the semiconductive wafer 14 in very precise alignment with any level of microcircuitry previously printed and formed at those same regions of the semiconductive wafer (alignments to within one-tenth of a micron being possible). Upon completion of that precision alignment step-and-repeat printing operation, the semiconductive wafer 14 is removed from alignment and exposure system 10 and processed as previously described to form the level of microcircuitry so printed at each of the desired array of adjacent regions 162 of the semiconductive wafer. These processing operations may also impair or obliterate the first small wafer alignment mark $170_1$ disposed alongside each of the selected regions 162 of the semiconductive wafer since the beam of light employed for viewing the aerial images of those first small wafer alignment marks includes exposure light as described above. However, this does not affect performance of the remaining precision alignment step-and-repeat printing operations since the remaining small wafer alignment marks $170_2 - 170_{n-1}$ formed on the semiconductive wafer and associated with the remaining reticles of the set are not illuminated until they are actually employed in performing those remaining precision alignment step-and-repeat printing operations with the associated reticles. The semiconductive wafer 14 is successively processed for each succeeding reticle 12 of the set of reticles in exactly the same manner as described above for the second reticle to successively print and form each level of microcircuitry contained on those reticles at each of the desired array of adjacent regions 162 of the semiconductive wafer. Following all of these processing operations, the semiconductive wafer 14 may be scribed and otherwise processed as indicated above to form a plurality of integrated circuits or the like.

At some point during the previously-described processing of a semiconductive wafer 14 with alignment and exposure system 10, the operator may desire to scan the semiconductive wafer to check for possible defects (such as might occur during an etching or depositing operation) or for some other reason. This may be done, without exposing a photosensitive film deposited over the semiconductive by employing air cylinder 54 to move green filter 45 into its operative position in the vertically extending portion 34c of optical path 34a-f, thereby passing only green illuminating light forward along that optical path when shutter 50 is opened; by employing crank 74 and air cylinder 75 to move compensating lens 76 into its operative position (shown in dashed lines in FIG. 1A), thereby correcting projection lens 18 for green light; by employing $\theta$ servo drive unit 51 to open shutter 50; by employing the Y axis servo drive unit 66 for moving slide 58 to position mask plate 60 in its operative position, thereby permitting illumination of at least a portion of whatever object is positioned on main stage 20 directly beneath the projection lens (a reticle 12 may or may not then be held by vacuum holder 17 of stage 16); by employing slide 123 to move beam bender 122 into its operative position in the horizontally extending portion 87e of dual optical path 87a-f, thereby permitting use of the first objective lens unit 90 with the binocular lens unit 93 to view an aerial image of whatever region of the semiconductive wafer may be disposed directly beneath the projection lens and illuminated by the green light passing through the mask plate 60; and by employing the X and Y axes servo drive units 25 and 27 for moving the main stage to scan the semiconductive wafer beneath the projection lens.

I claim:

1. A method for aligning first and second relatively-moveable objects with respect to one another, said method comprising the steps of:
   supporting each of the first and second objects for independent movement along coordinate first and second axes and about a coordinate third axis;
   aligning the first object with respect to the coordinate first and second axes; and
   aligning the second object with respect to the coordinate first and second axes and, hence, with respect to the first object.

2. A method as in claim 1 wherein:
   said first object comprises a reticle; and
   said second object comprises a semiconductive wafer.

3. A method as in claim 1 wherein:
   said first-mentioned aligning step comprises aligning an image of the first object with respect to a reference mark at a first coordinate position, the reference mark itself having previously been aligned with respect to the coordinate first and second axes and being disposed for movement with the second object; and
   said second-mentioned aligning step comprises aligning the second object with respect to an image of one or more alignment reticles, the image of said one or more alignment reticles itself having previously been aligned with respect to the reference mark at a second coordinate position;
   whereby the first and second coordinate positions define a coordinate offset by which the second object can be moved following its alignment with respect to the image of said one or more alignment reticles to position a selected region of the second object in alignment with respect to an image of a portion of the first object, thereby facilitating printing of that image at the selected region.

4. A method as in claim 2 wherein:
   said first object comprises a reticle; and
   said second object comprises a semiconductive wafer.

5. A method for aligning first and second relatively moveable objects with respect to one another to facilitate step-and-repeat printing of an image of a microcircuitry portion of the first object at different regions of the second object in nominal registration with microcircuitry previously printed at each of those same regions, said method comprising the steps of:
   aligning one or more global alignment marks of the second object with respect to an image of one or more corresponding reference global alignment marks; and
   aligning a precision local alignment mark disposed between selected ones of said regions of the second object with respect to an image of a corresponding precision local alignment mark of the first object;
   whereby the image of the microcircuitry portion of the first object may be printed at said selected regions of the second object in more precise registration with microcircuitry previously printed at each of those same regions.

6. A method as in claim 5 wherein:
   said first object comprises a reticle; and
   said second object comprises a semiconductive wafer.

7. A method as in claim 5 including the steps of:
   storing information indicative of the relative displacements effected between the first and second objects to align the precision local alignment mark of the second object with respect to the image of the corresponding precision local alignment mark of the first object; and
   employing that information to facilitate step-and-repeat printing of the image of the microcircuitry portion of the first object at said regions of the second object in more precise registration with the microcircuitry previously printed at each of those same regions.

8. A method as in claim 7 wherein:
   said first object comprises a reticle; and
   said second object comprises a semiconductive wafer.

* * * * *